United States Patent
Small

(10) Patent No.: US 11,079,742 B2
(45) Date of Patent: *Aug. 3, 2021

(54) AUTOMATED BREADBOARD WIRING ASSEMBLY

(71) Applicant: Austin Small, Lower Gwynedd, PA (US)

(72) Inventor: Austin Small, Lower Gwynedd, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/126,819

(22) Filed: Dec. 18, 2020

(65) Prior Publication Data

US 2021/0109508 A1    Apr. 15, 2021

Related U.S. Application Data

(63) Continuation of application No. 16/589,693, filed on Oct. 1, 2019.

(Continued)

(51) Int. Cl.
*H05K 7/00* (2006.01)
*G05B 19/418* (2006.01)
(Continued)

(52) U.S. Cl.
CPC ......... *G05B 19/41805* (2013.01); *H05K 1/18* (2013.01); *H05K 7/08* (2013.01); *G05B 2219/34215* (2013.01); *G05B 2219/40111* (2013.01); *G06F 3/0486* (2013.01); *G06F 3/04847* (2013.01); *G06F 3/04886* (2013.01);
(Continued)

(58) Field of Classification Search
CPC .... G05B 19/41805; G05B 2219/34215; G05B 2219/40111; H05K 1/18; H05K 7/08; H05K 2201/10166; H05K 2201/10053; H05K 2201/10106; G06F 3/04847; G06F 3/04886; G06F 3/0486
See application file for complete search history.

(56) References Cited

U.S. PATENT DOCUMENTS 5,629,838 A * 5/1997 Knight ............... G01R 31/3025
361/782
2005/0057517 A1* 3/2005 Rix ....................... G06F 3/0238
345/168

(Continued)

*Primary Examiner* — Yuriy Semenenko
(74) *Attorney, Agent, or Firm* — Massina Pat. & TM Law PLLC

(57) ABSTRACT

An automated breadboard wiring assembly includes a breadboard with holes therein defining at least two nodes and at least a primary wiring board. The primary wiring board has a wiring matrix composed of a plurality of interconnected wiring segments, each wiring segment having a switch therealong. A plurality of contacts are interconnected with the wiring matrix with a switch positioned between each contact and the wiring matrix. Each contact is configured to engage a respective one of the breadboard nodes. An input device is configured to indicate desired wires between nodes and the locations of the desired wires define wiring information. A microprocessor configured to receive wiring information from the input device and open selective ones of the switches such that an electrical path along selective ones of the contacts and the wire segments is defined to correspond to each desired wire set forth in the wiring information.

20 Claims, 19 Drawing Sheets

Related U.S. Application Data

(60) Provisional application No. 62/739,893, filed on Oct. 2, 2018, provisional application No. 62/753,224, filed on Oct. 31, 2018, provisional application No. 62/826,074, filed on Mar. 29, 2019.

(51) Int. Cl.
    *H05K 1/18*     (2006.01)
    *H05K 7/08*     (2006.01)
    *G06F 3/0488*     (2013.01)
    *G06F 3/0484*     (2013.01)
    *G06F 3/0486*     (2013.01)

(52) U.S. Cl.
    CPC ............ *H05K 2201/10053* (2013.01); *H05K 2201/10106* (2013.01); *H05K 2201/10166* (2013.01)

(56) References Cited

U.S. PATENT DOCUMENTS

| | | | |
|---|---|---|---|
| 2014/0017912 A1* | 1/2014 | Ha | H05K 1/14 439/74 |
| 2014/0178845 A1* | 6/2014 | Riesberg | G09B 23/181 434/301 |
| 2017/0363678 A1* | 12/2017 | Zubia | G01R 31/31908 |
| 2018/0060477 A1* | 3/2018 | Maisel | G06F 30/392 |
| 2020/0103870 A1* | 4/2020 | Small | H05K 7/08 |

* cited by examiner

AUTOMATED BREADBOARD WIRING ASSEMBLY

This application is a continuation of U.S. application Ser. No. 16/589,693, filed Oct. 1, 2019 and claims the benefit of U.S. Provisional Appln. No. 62/739,893, filed Oct. 2, 2018, U.S. Provisional Appln. No. 62/753,224, filed Oct. 31, 2018, and U.S. Provisional Appln. No. 62/826,074, filed Mar. 29, 2019, the contents of each of which are incorporated herein by reference.

FIELD OF THE INVENTION

This invention relates to breadboard prototyping. More particularly, the invention relates to an automated breadboard wiring assembly.

BACKGROUND OF THE INVENTION

Referring to FIGS. 1 and 2, a breadboard 10 is a solderless device for temporary prototyping with electronics and testing circuit designs. The breadboard 10 includes a physical board 12 with a plurality of holes 14 defined therein. The breadboard 10 has strips of metal (not shown) underneath the board 12 that connect the holes 14 on the top of the board 12 within a given node 16a, 16b.

Most electronic components 15, 17, 19 (e.g. resistors, capacitors, integrated circuits, etc.) in electronic circuits can be interconnected by inserting their leads or terminals into the holes 14 and then making connections through wires 18 where appropriate. As illustrated in FIG. 2, in some circuits the number of wires 18 necessary to complete the circuit may be significant. Placing of the wires is a time-consuming and error-prone process. Even one small mistake in placement of one of the wire ends can lead to hours of debugging to fix the circuit.

SUMMARY OF THE INVENTION

In at least one embodiment, the present invention provides an automated breadboard wiring assembly. The assembly includes a breadboard with holes therein defining at least two nodes. The assembly includes a breadboard with holes therein defining at least two nodes and at least a primary wiring board. The primary wiring board has a wiring matrix composed of a plurality of interconnected wiring segments, each wiring segment having a switch therealong. A plurality of contacts are interconnected with the wiring matrix with a switch positioned between each contact and the wiring matrix. Each contact is configured to engage a respective one of the breadboard nodes. An input device is configured to indicate desired wires between nodes and the locations of the desired wires define wiring information. A microprocessor configured to receive wiring information from the input device and open selective ones of the switches such that an electrical path along selective ones of the contacts and the wire segments is defined to correspond to each desired wire set forth in the wiring information.

In at least one embodiment, the present invention provides an automated breadboard wiring assembly. The assembly includes a breadboard with holes therein defining at least two nodes and at least a primary wiring board. The primary wiring board has a wiring matrix composed of a plurality of interconnected wiring segments, each wiring segment having a switch therealong. A plurality of contacts are interconnected with the wiring matrix with a switch positioned between each contact and the wiring matrix. Each contact is configured to engage a respective one of the breadboard nodes. An input device has a screen configured to display a virtual breadboard corresponding to the breadboard. The input device is configured to position virtual circuit components and virtual wires on the virtual breadboard with the locations of the virtual wires defining wiring information. A microprocessor is configured to receive the wiring information from the input device and open selective ones of the switches such that an electrical path along selective ones of the contacts and the wire segments is defined to correspond to each virtual wire set forth in the wiring information.

BRIEF DESCRIPTION OF THE DRAWINGS

The accompanying drawings, which are incorporated herein and constitute part of this specification, illustrate the presently preferred embodiments of the invention, and, together with the general description given above and the detailed description given below, serve to explain the features of the invention. In the drawings.

DETAILED DESCRIPTION OF THE INVENTION

Figure 1:
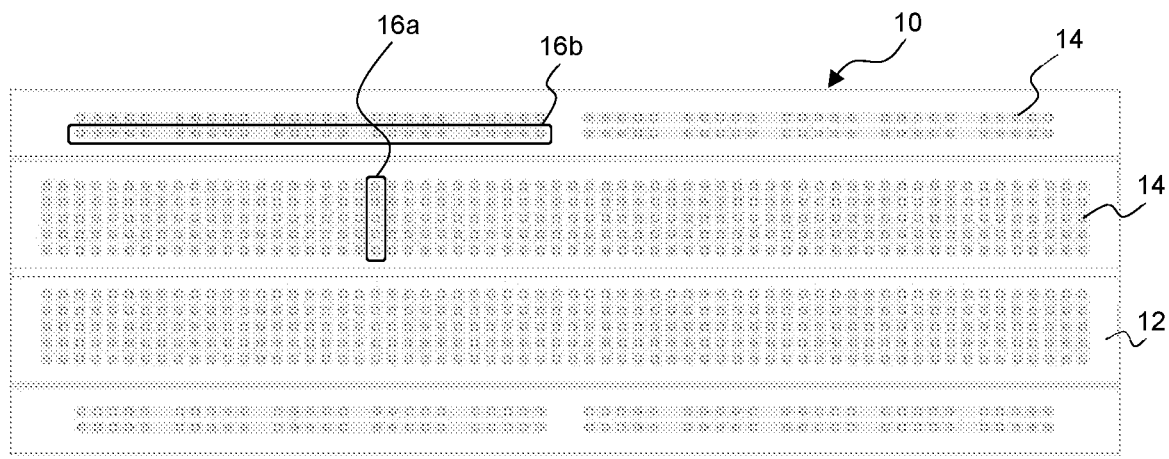
FIG. 1 is a top plan view of an illustrative prior art breadboard.
Figure 2:
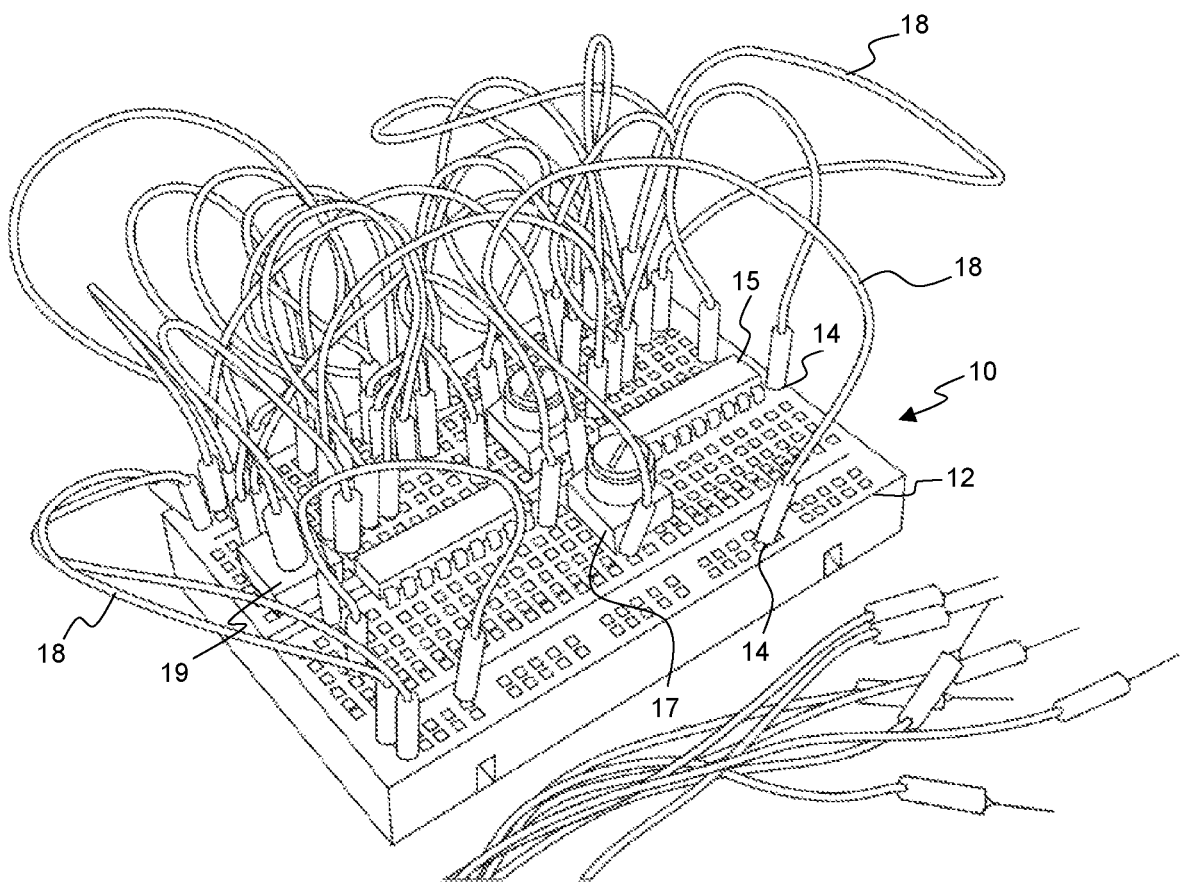
FIG. 2 is a perspective view of the breadboard of FIG. 1 with an illustrative circuit wired thereon.

In the drawings, like numerals indicate like elements throughout. Certain terminology is used herein for convenience only and is not to be taken as a limitation on the present invention. The following describes preferred embodiments of the present invention. However, it should be understood, based on this disclosure, that the invention is not limited by the preferred embodiments described herein.

Figure 3:
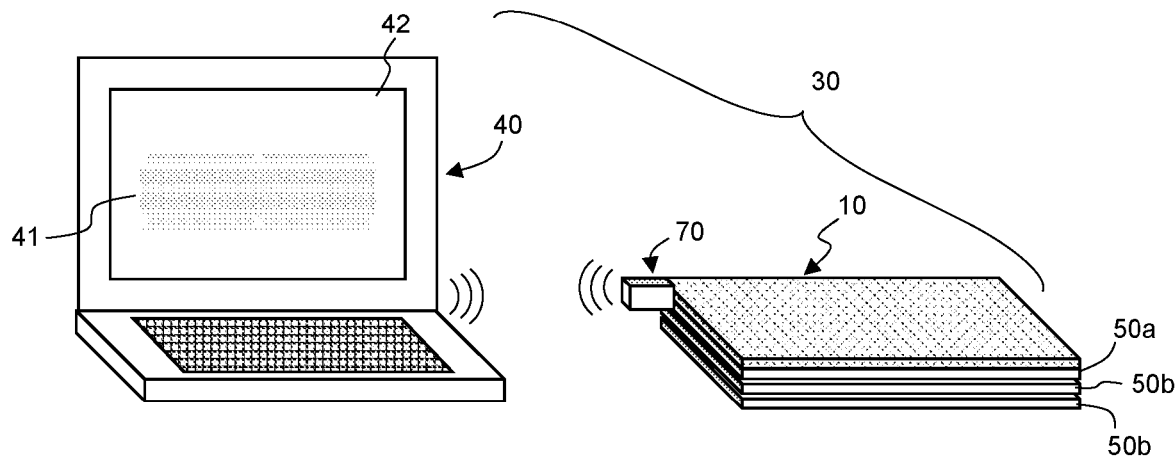
FIG. 3 is a schematic diagram of an automated breadboard wiring assembly in accordance with an embodiment of the disclosure.

Referring to FIG. 3, an automated breadboard wiring assembly 30 in accordance with an embodiment of the disclosure is shown. The assembly 30 generally includes an input device 40, at least one wiring board 50a, 50b and a microcontroller 70. The microcontroller 70 may be, for example, a Raspberry Pi processor which is connected to the breadboard 10 via a GPIO expander or the like. It is recognized that the disclosure is not limited to this specific processor and other processing devices may be utilized. The input device 40 and microcontroller 70 are illustrated with a Wi-Fi interconnection, however, other communication interconnections may be utilized including wired and non-wired interconnections.

The input device 40 includes a screen 42 for displaying a virtual breadboard 41. As will be described hereinafter, the input device 40 is utilized to position circuit components and wiring on the virtual breadboard 41. The input device 40 may be any type of processing device that includes a screen and allows for input of the circuit components and the wiring, for example, a personal computer, a laptop, a tablet, a smart phone or the like. The microcontroller 70 receives wiring information from the input device 40 and controls switches (as described hereinafter) on the wiring boards 50a, 50b to automatically electronically interconnect circuit components positioned on the physical breadboard 10. As such, the automated breadboard wiring assembly 30 reduces the time necessary for wiring of the breadboard 10 and also reduces the likelihood of wiring error and the associated debugging time.

Figure 4:
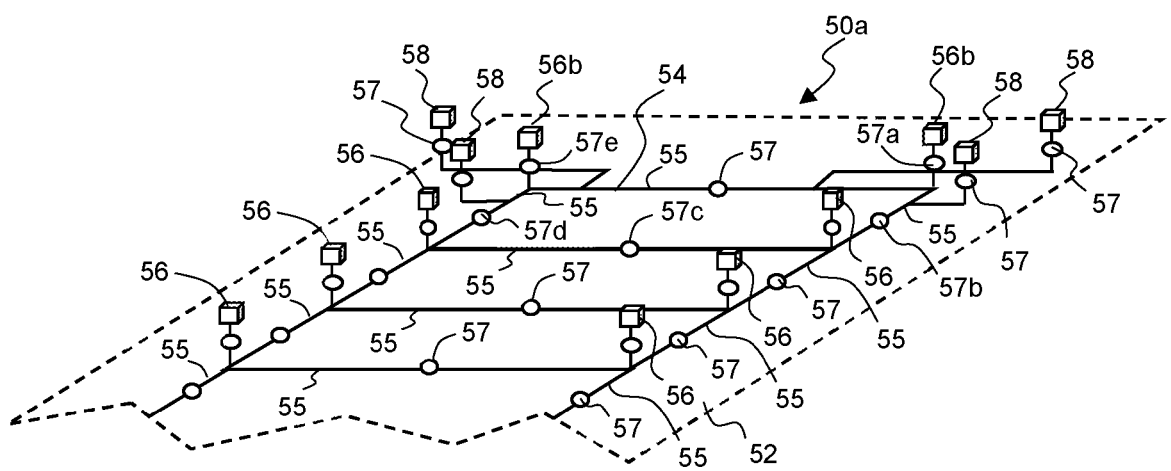
FIG. 4 is a perspective view of a portion of a primary wiring board of the automated breadboard wiring assembly of FIG. 3.

Referring to FIG. 4, a primary wiring board 50a in accordance with an embodiment of the disclosure will be described. The primary wiring board 50a includes a board 52 which supports an electronically interconnected wiring matrix 54. The board 52 and wiring matrix 54 may be, for example, in the form of a PCB, however, other structures may be utilized. The wiring matrix 54 is composed of a plurality of interconnected wire segments 55. Each of the wire segments 55 has a switch 57 thereon to control flow of electricity through the wire segment 55. Each of the switches 57 is configured to be controlled by the microcontroller 70 and has a default closed condition.

Figure 5:
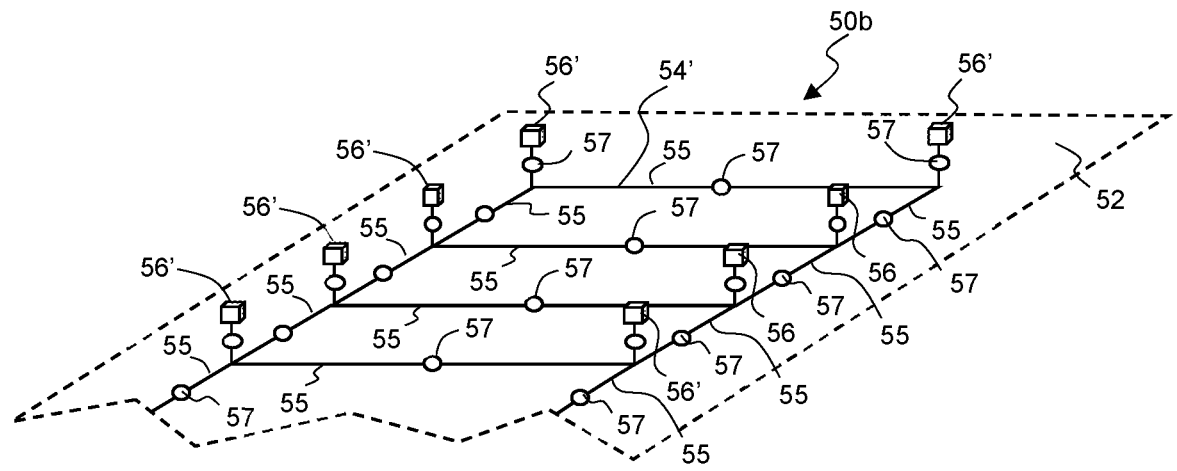
FIG. 5 is a perspective view of a portion of a secondary wiring board of the automated breadboard wiring assembly of FIG. 3.
Figure 6:
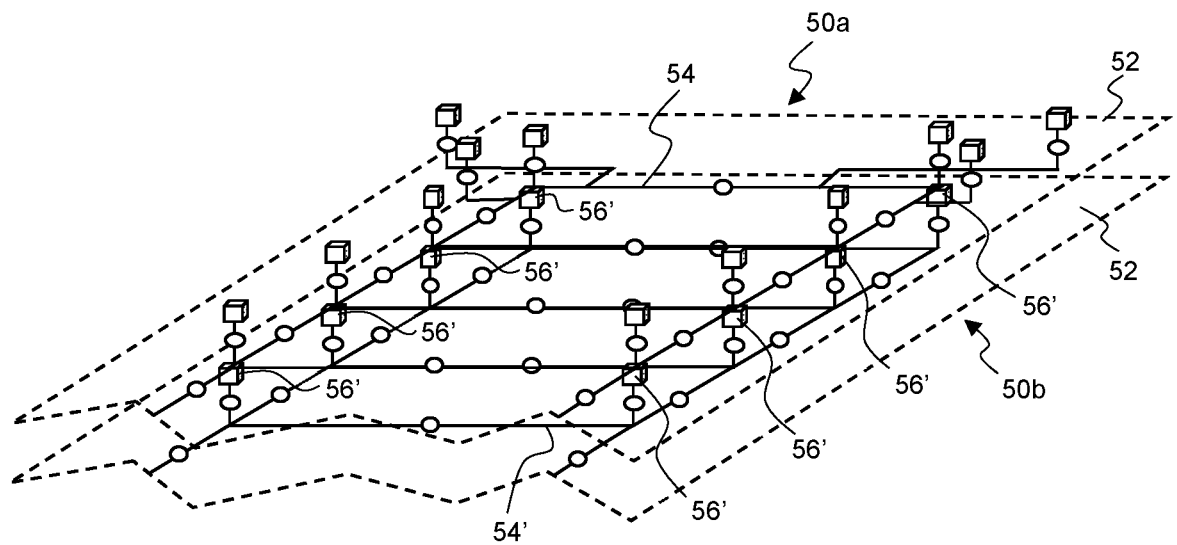
FIG. 6 is a perspective view illustrating the secondary wiring board interconnected with the primary wiring board.

A plurality of contacts 56, 58 are supported by the board 52. Each of the contacts 56 is configured to electrically connect with a respective node 16a of the breadboard 10 and each of the contacts 58 is configured to electrically connect with a respective node 16b of the breadboard. Each of the contacts 56, 58 are electrically connected to a switch 57 which in turn is electrically connected to the wiring matrix 54. Again, each of the switches 57 is configured to be controlled by the microcontroller 70 and has a default closed condition. As such, when the primary wiring board 50a is interconnected with the breadboard 10, each of the contacts 56, 58 engages a respective node 16a, 16b, however, none of the nodes 16a, 16b is electrically interconnected with the wiring matrix 54. Upon instruction to initiate automatic wiring, the microcontroller 70 opens selected switches 57 proximate the necessary contacts 56, 58 to interconnect the associated nodes 16a, 16b with the wiring matrix 54. The microcontroller 70 also opens the switches 57 along the necessary wiring segments 55 to interconnect the nodes 16a, 16b, and thereby the circuit components positioned therein, based on the wiring information received from the input device 40. As an example, with reference to FIG. 4, to electronically wire contact 56a with contact 56b, the microcontroller 70 would open switches 57a, 57b, 57c, 57d, 57e For some circuits, the primary wiring board 50a may be sufficient to achieve the desired circuit wiring, however, for complex circuits, additional wiring options may be required. To facilitate such, secondary wiring boards 50b may be connected with the primary wiring board 50a. In the illustrative example in FIG. 3, two secondary wiring boards 50b are connected to the primary wiring board 50a, however, more or fewer secondary wiring boards may be utilized. Referring to FIG. 5, each secondary wiring board 50b has a structure similar to the primary wiring board 50a, except that the contacts 58 for nodes 16b are not included. As such, the secondary wiring board 50b includes a board 52 which supports another electronically interconnected wiring matrix 54'. Again, the matrix 54' is made up of a plurality of wire segments 55 with each segment having a control switch 57 therealong. A plurality of contacts 56' are supported by the board 52 and are configured to engage the wiring matrix 54 of the wiring board 50a positioned thereabove, as shown in FIG. 6. A switch 57 is provided adjacent each contact 56' and controls electrical connection between the contact 56' and the wiring matrix 54'. Again, each of the switches 57 has a default closed condition. As such, the secondary wiring matrix 54' is not electrically interconnected with the primary wiring matrix 54 until at least one of the switches 57 associated with one of the contacts 56' on the secondary wiring board 50b is opened by the microcontroller 70. Any desired number of secondary wiring boards 50b may be stacked below and interconnected with the primary wiring board 50a to achieve a wiring matrix of a desired complexity.

Figure 7:
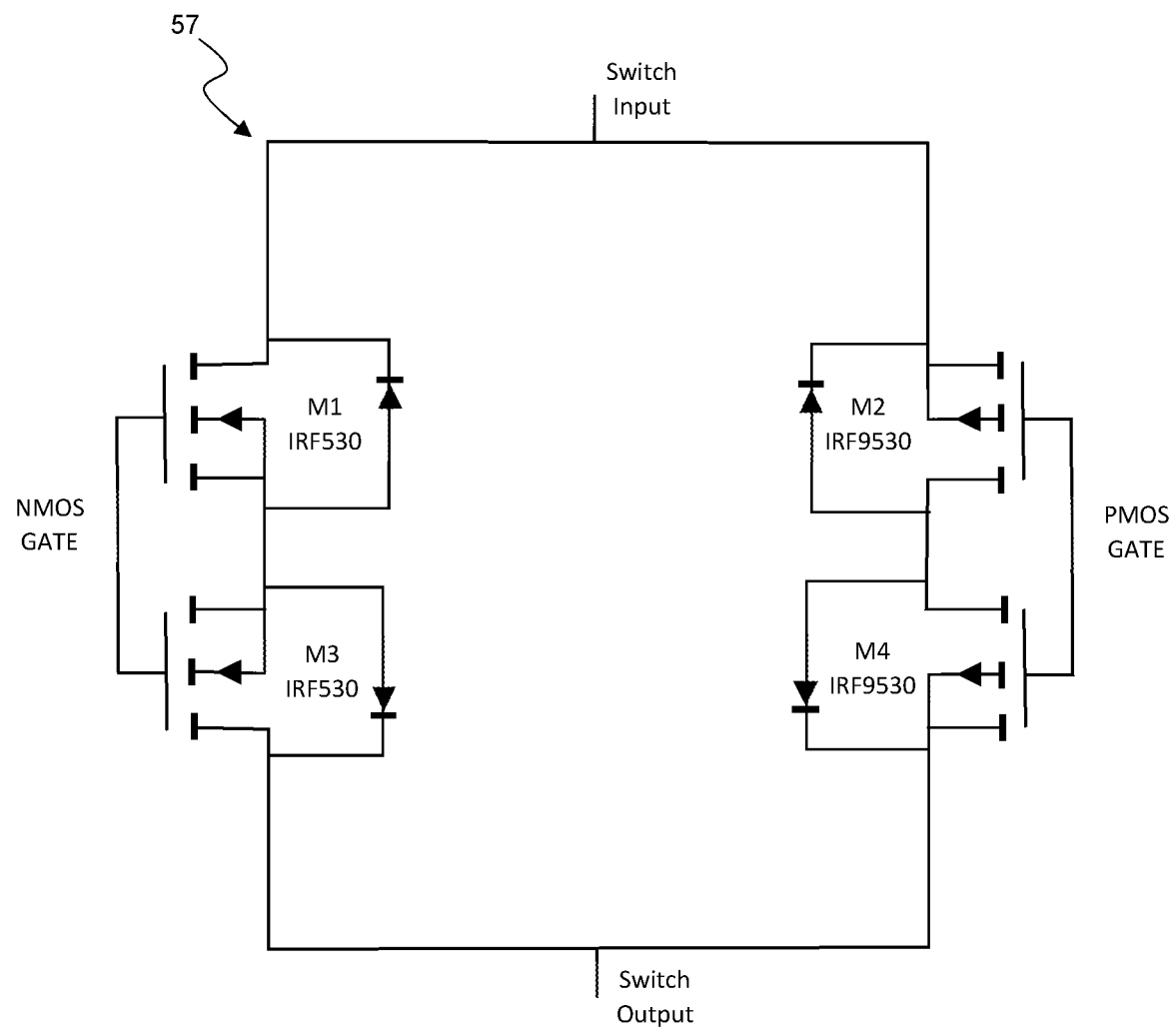
FIG. 7 is a schematic diagram of an illustrative electrically controlled switch in accordance with an embodiment of the disclosure.

Referring to FIG. 7, an illustrative switch 57 for use along the wire segments 55 and proximate each of the contacts 56, 58 will be described. The illustrated switch 57 is a bidirectional, voltage invariant switch. The switch 57 includes a nmos gate in parallel with a pmos gate. Each of the gates includes a pair of oppositely facing transistors, with each transistor of the pair acting as a switch in one direction while the other transistor acts as a switch in the opposite direction. The back-to-back transistors (both nmos in one of the gates and both pmos in the other gate) allows for bidirectional switching.

Use of both a nmos gate and a pmos gate in parallel allows the switch to be voltage invariant. More specifically, a nmos transistor only conducts when gate voltage (Vg) minus source voltage (Vs) is greater than a voltage threshold (e.g. approximately 1.5 to 3.0 volts). In the open state Vg is a static 5 volts and Vs must be less than 3.5 volts to achieve the voltage threshold. Conversely, the pmos transistor conducts when Vg–Vs is less than –1.5. In the open state Vg is 0 volts and the pmos transistor will conduct when Vs is greater than 1.5 volts. With this configuration, any voltage presented at the switch input will appear undistorted at the switch output. It is noted that the switch input and switch output can be interchanged without any effect on the behavior of the switch. By controlling gate voltages, the microcontroller 70 can open or close a switch. It is noted that the disclosure is not limited to this specific switch design and other bidirectional switches/relays may be utilized.

Figure 8A:
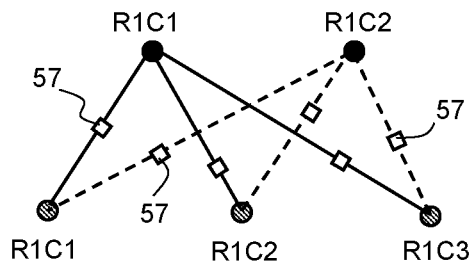
FIGS. 8A and 8B are each a schematic diagram illustrating interconnection between nodes of the primary wiring board with nodes of a secondary wiring board along a single row of the breadboard.
Figure 8B:
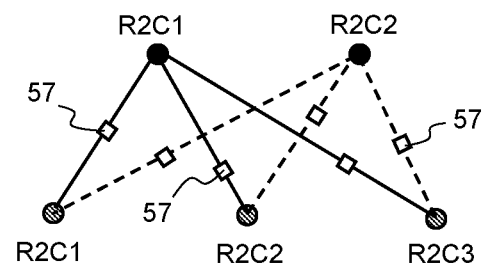
Figure 9:
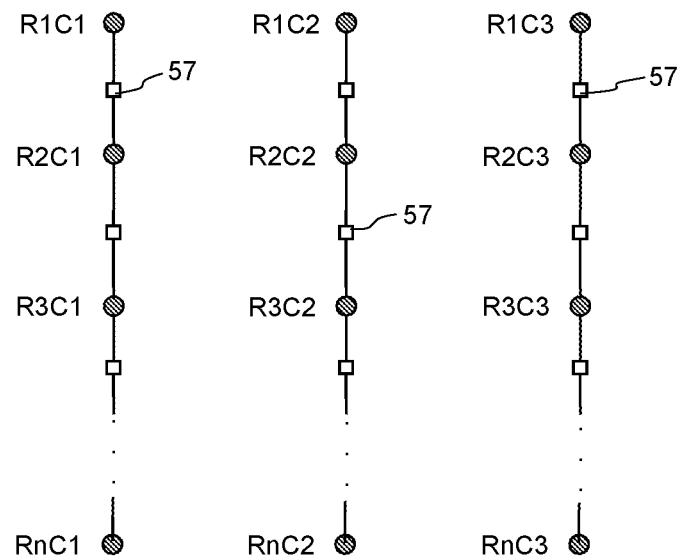
FIG. 9 is a schematic diagram illustrating interconnection between nodes of the secondary wiring board.
Figure 10:
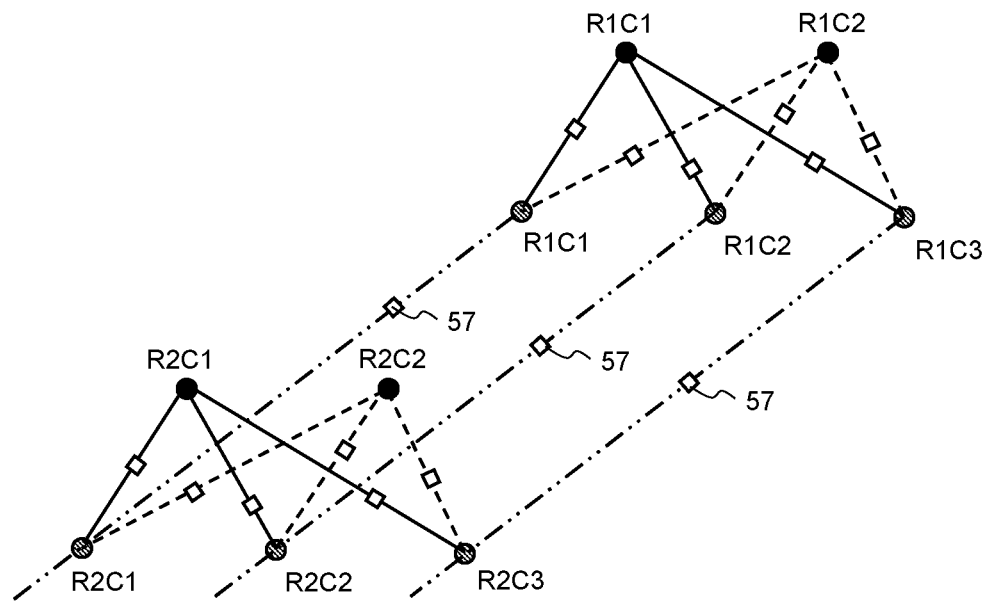
FIG. 10 is a schematic diagram illustrating interconnection between nodes of the primary wiring board with nodes of a secondary wiring board and also amongst nodes of the secondary wiring board.

Referring to FIGS. 8-10, an illustrative wire routing utilizing a primary wiring board, referred to as the "breadboard layer", and a secondary wiring board, referred to as the "virtual column layer". In FIGS. 8-10, the breadboard nodes are shown as black circles and the routing vertices are shown as gray circles. FIG. 8A shows a horizontal slice through row 1 of the breadboard layer, connecting 1 row of breadboard nodes to 1 row of routing vertices while FIG. 8B shows a horizontal slice through row 2 of the breadboard layer, again wherein 1 row of breadboard nodes is connected to 1 row of routing vertices. Such an interconnection is formed for each row of the breadboard.

For the purpose of this explanation, the dimensions of the breadboard nodes are 15×2, but different dimensions can be selected. Furthermore, note that the rows of routing vertices match 1:1 with the rows of breadboard nodes. But, the number of columns of routing vertices is independent of the number of breadboard node columns. In this illustrative case, there are 15 rows of routing vertices, but 3 columns. FIG. 9 is a top-down view of the virtual routing layer. Adjacent routing vertices within the same column are connected by switches 57. As shown in FIG. 10, the routing vertices allow the rows to be interconnected.

Wire routing between breadboard pins happens in the following way. The user selects a starting point (RA, CA) and an ending point (RB, CB). These coordinates correspond to two breadboard nodes. Without loss of generality, assume that RA<RB for the following explanation.

A virtual column X is selected that meets the following condition: routing vertices [(RA, X), (RA+1, X), . . . , (RB, X)] are unassigned. Once a virtual column has been identified, the corresponding switches/edges as identified by either a breadboard node and a virtual vertex, or two virtual vertices, are turned on. In the illustrated embodiment, the following switches would be turned on:

(RA, CA, breadboard node)<->(RA, X, virtual vertex)
(RA, X, virtual vertex)<->(RA+1, X, virtual vertex)
. . .
(RB–1, X, virtual vertex)<->(RB, X, virtual vertex)
(RB, X, virtual vertex)<->(RB, CB, breadboard node)

In addition to turning on all of these switches, each of the routing vertices that are endpoints of these switches are marked as assigned to this wire so that two wires aren't crossed. If it is desired to remove a wire, such is accomplished by turning off these switches and marking the associated routing vertices as unassigned.

To facilitate routing a breadboard pin to power/ground, each breadboard node is connected to a unique switch which is connected to power and a unique switch which is connected to ground. It is contemplated that each breadboard node may have two unique power switches, one connected to 5V power and one connected to 3.3V power. Therefore, a pin can be routed to power by turning on the switch that connects it to power (either 5V or 3.3V). Similarly, a pin can be routed to ground by turning on the switch that connects it to ground.

Figures 11A, 11B:
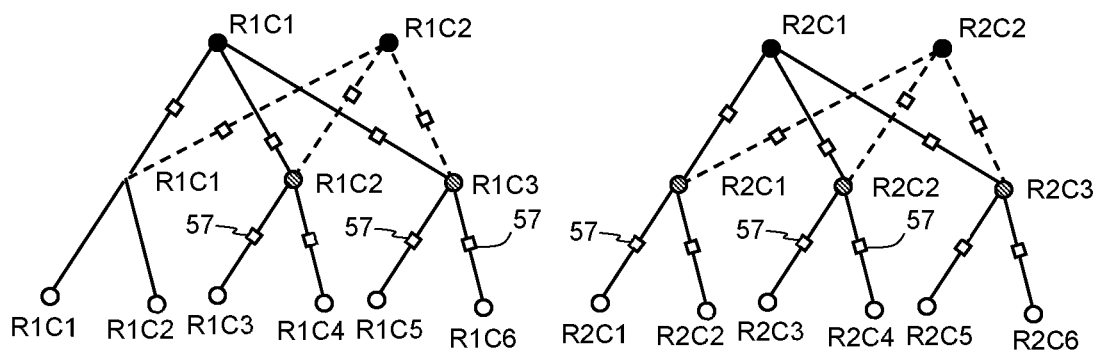
FIGS. 11A and 11B are each a schematic diagram illustrating interconnection between nodes of the primary wiring board with nodes of first and second secondary wiring boards along a single row of the breadboard.
Figure 12:
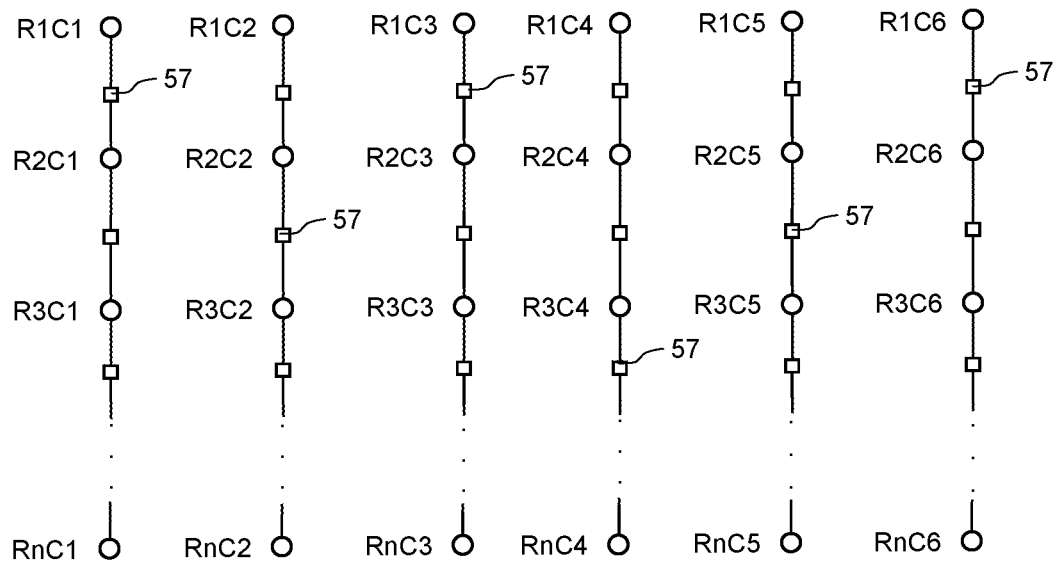
FIG. 12 is a schematic diagram illustrating interconnection between nodes of the second secondary wiring board.
Figure 13:
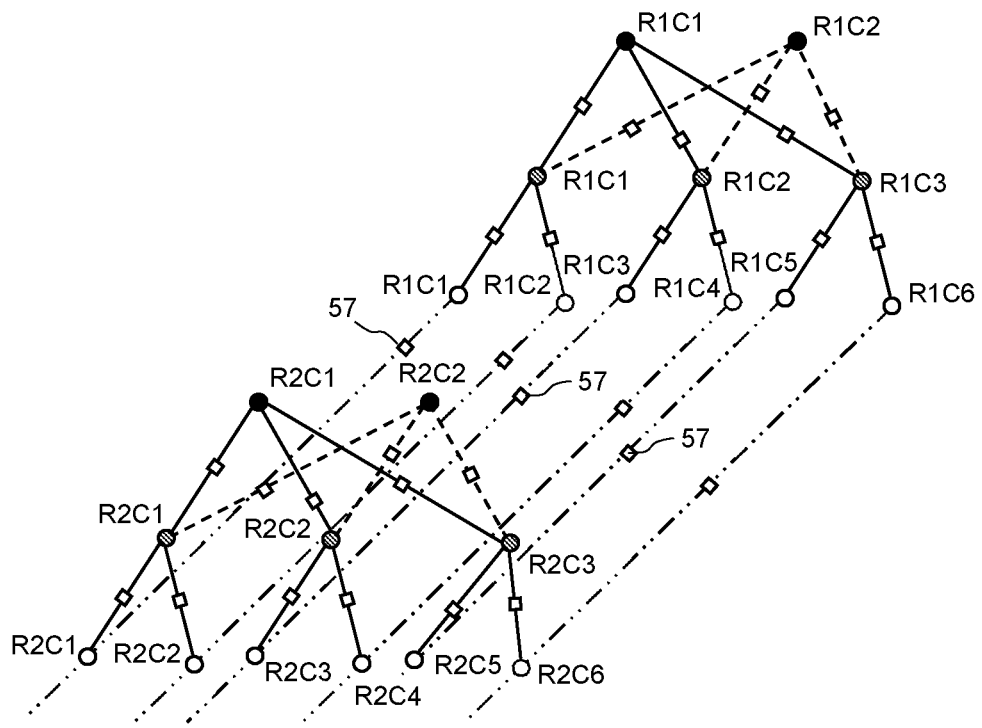
FIG. 13 is a schematic diagram illustrating interconnection between nodes of the primary wiring board with nodes of the first and second secondary wiring board and also amongst nodes of the second secondary wiring board.
Figure 14:
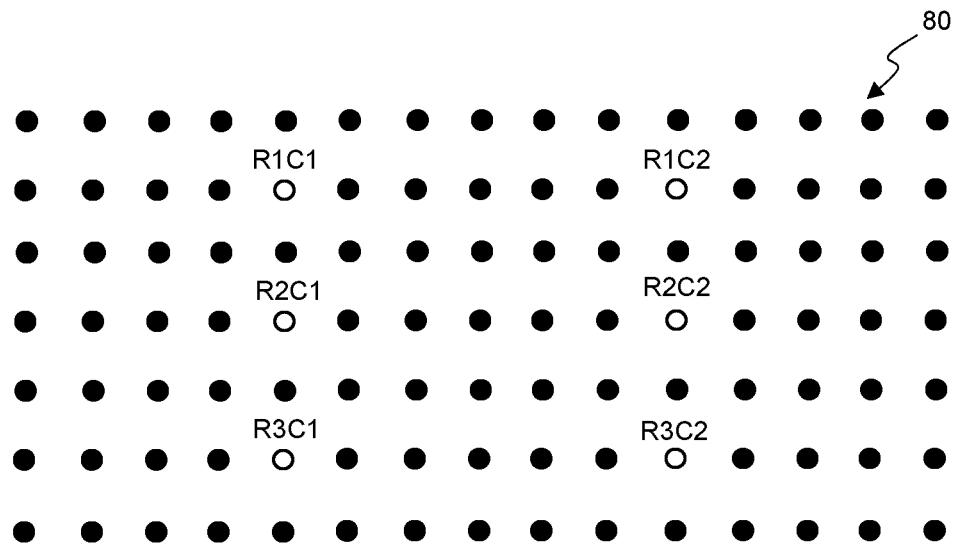
FIGS. 14-19 are schematic diagrams illustrating an LED indicator assembly for visually indicating interconnected nodes.
Figure 15:
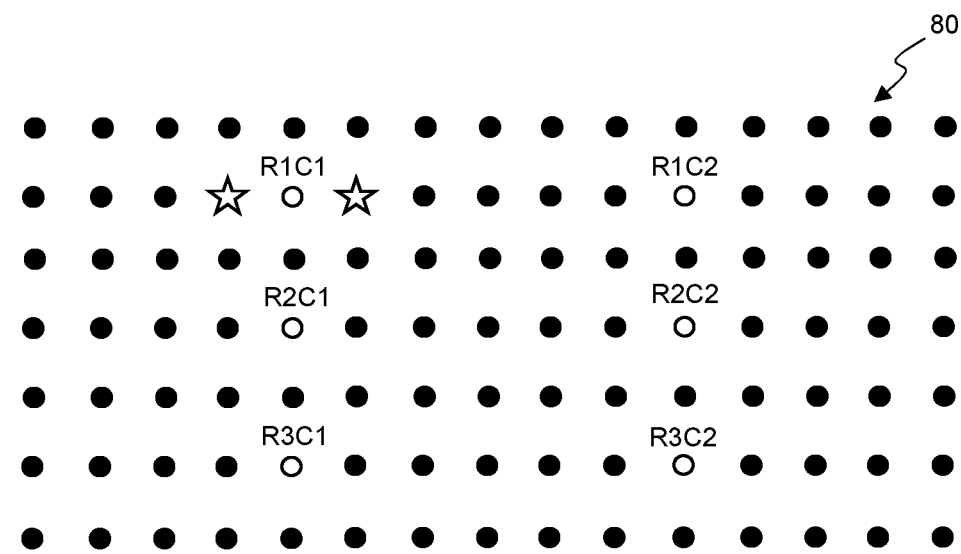

Referring to FIGS. 11-13, an illustrative wire routing utilizing a primary wiring board, referred to as the "breadboard layer", and a first secondary wiring board, referred to as the "bridge layer" and a second secondary wiring board, referred to as the "virtual column layer". In FIGS. 11-13, the breadboard nodes are shown as black circles, the bridge vertices are shown as gray circles and the routing vertices are shown as white circles.

The breadboard layer connects directly to each breadboard node and can create electrical connections between breadboard nodes and vertices in the bridge layer. The bridge layer sits between the breadboard layer and the virtual column layer and can create electrical connections between the breadboard layer and the virtual column layer. Note that the breadboard layer and the bridge layer only create electrical connections within the context of a single breadboard row. Finally, the virtual column layer sits below the bridge layer. Similar to the previous embodiment, the virtual column layer allows electrical connections to span across multiple breadboard rows.

FIG. 11A shows a horizontal slice through row 1 of the breadboard layer, connecting 1 row of breadboard nodes to 1 row of bridge layer nodes which in turn connects to one row of routing vertices. FIG. 11B shows a horizontal slice through row 2 of the breadboard layer, again wherein 1 row of breadboard nodes is connected to 1 row of bridge layer nodes which in turn connects to one row of routing vertices. For the purpose of this explanation, the dimensions of the breadboard nodes are 15×2, but different dimensions can be selected. The above structure is replicated 15 times, once for each of the 15 breadboard rows.

Importantly, the number of bridge vertices for a single row (3 in the illustrated embodiment) is independent of the number of breadboard columns (2 in the illustrated embodiment). Furthermore, each bridge vertex is connected to its own set of virtual column vertices. Each bridge vertex is assigned the same number of virtual column vertices, although there are no limitations to this number. In the illustrated embodiment, there are 2 virtual columns for each bridge vertex such that there are 6 virtual columns as illustrated in FIG. 12. As a reminder, the virtual column layer sits below the bridge layer, and the virtual column layer spans across multiple breadboard rows as shown in FIG. 13.

Wire routing happens in the following way. The user selects a starting point (RA, CA) and an ending point (RB, CB). These coordinates correspond to two breadboard nodes. Without loss of generality, assume that RA<RB for the following explanation.

A virtual column CX is selected that meets the following conditions: virtual column vertices [(RA, CX), (RA+1, CX), (RB, CX)] within the virtual column layer are unassigned. Furthermore, bridge vertices (RA, C{floor((X+1)/2)}) and (RB, C{floor((X+1)/2)}) are available.

Once a virtual column X has been identified, the corresponding switches/edges, as identified by a breadboard node and a bridge vertex, a bridge vertex and a virtual column vertex, or two virtual column vertices, are turned on. So, in the example of a connection between (RA, CA) and (RB, CB), the following switches would be turned on:

(RA, CA, breadboard node)<->(RA, C{floor((X+1)/2)}), branch vertex)

(RA, C{floor((X+1)/2)}, branch vertex)<->(RA, CX, virtual column vertex)

(RA, CX, virtual column vertex)<->(RA+1, CX, virtual column vertex) . . . .

(RB−1, CX, virtual column vertex)<->(RB, CX, virtual column vertex)

(RB, CX, virtual column vertex)<->(RB, C{floor((X+1)/2)}, bridge vertex)

(RB, C{floor((X+1)/2)}, bridge vertex)<->(RB, CB, breadboard node)

Consider the following concrete example wherein no wires have been placed yet, so all bridge and virtual column vertices are available. Referring to FIGS. 12 and 13, a wire from R1C1 to R3C2 can be routed by turning on the following edges:

(R1, C1—breadboard node)<->(R1, C1—branch vertex)

(R1, C1—branch vertex)<->(R1, C1—virtual column vertex)

(R1, C1—virtual column vertex)<->(R2, C1—virtual column vertex)

(R2, C1—virtual column vertex)<->(R3, C1—virtual column vertex)

(R3, C1—virtual column vertex)<->(R3, C1—bridge vertex)

(R3, C1—bridge vertex)<->(R3, C2—breadboard node)

In addition to turning on all of these switches, each of the routing vertices that are endpoints of these switches are marked as assigned to this wire so that two wires aren't crossed. If it is desired to remove a wire, such is accomplished by turning off these switches and marking the associated routing vertices as unassigned.

To facilitate routing a breadboard pin to power/ground, each breadboard node is connected to a unique switch which is connected to power and a unique switch which is connected to ground. It is contemplated that each breadboard node may have two unique power switches, one connected to 5V power and one connected to 3.3V power. Therefore, a pin can be routed to power by turning on the switch that connects it to power (either 5V or 3.3V). Similarly, a pin can be routed to ground by turning on the switch that connects it to ground.

Referring to FIGS. 14-19, alternative assemblies and methods for identifying and displaying an available wiring path will be described. In each of these embodiments, the wiring path is shown on a 2D LED matrix 80 and a breadth-first search (BFS) algorithm is utilized to identify open paths. In each of the figures, a black dot represents an unlit LED, and a white circle represents a breadboard pin. In the illustrated embodiment, the dimensions of the breadboard pins are 3 rows×2 columns, however, more or fewer of each may be utilized.

With this assumption, the LEDs are organized in the following way. First, if we think about this in terms of columns of LEDs. Notice that to the left of the first column of LEDs that is interspersed with breadboard pins, there are 4 columns just of LEDs. Then a column where the LEDs alternate with breadboard pins. Between two columns of LEDs interspersed with breadboard pins, there are 5 columns of just LEDs. Finally, after the last column of LEDs interspersed with breadboard pins, there are another 4 columns just of LEDs.

Now, if we consider this in terms of rows of LEDs, a row of just LEDs alternates with a row of LEDs interspersed with breadboard pins. Therefore, the number of columns of LEDs in a design with 3×2 breadboard pins, there are 4+1+5+1+4=15 columns of LEDs. The number of rows of LEDs in this design is 3*2+1=7.

When tracing wires, a few rules are imposed upon our BFS search so that the wires can be displayed in a visually appealing manner and the number of turns taken by a wire is minimized:

1—Wires connect breadboard pins (2 or more). In order to indicate that a wire is connected to a breadboard pin, the LED within the same row as that breadboard pin and directly adjacent (to the left and/or right) is lit-up. So, as an example, if a wire is connected to R1C1, then one of the two (or both) LEDs may be lit-up, as shown as a star in FIG. 15, to indicate this connection.

Figure 16:
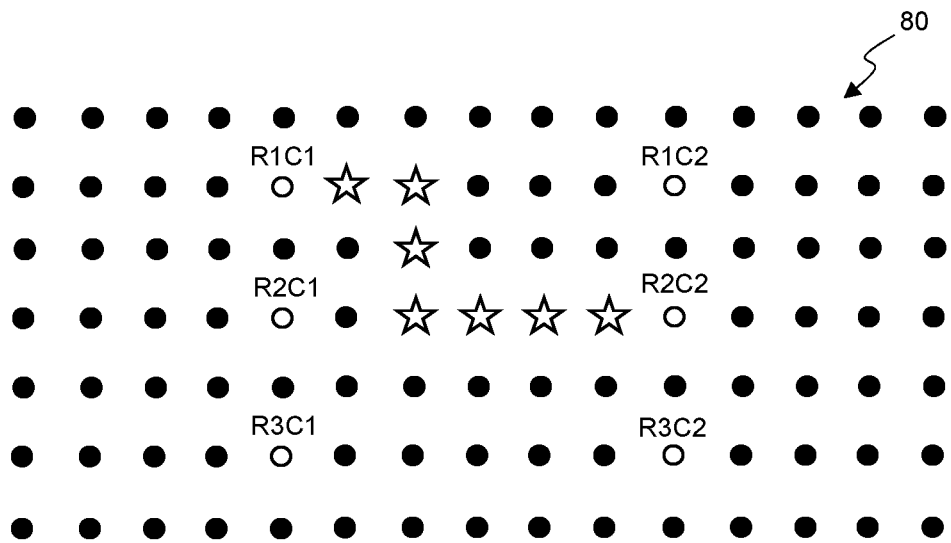
Figure 17:
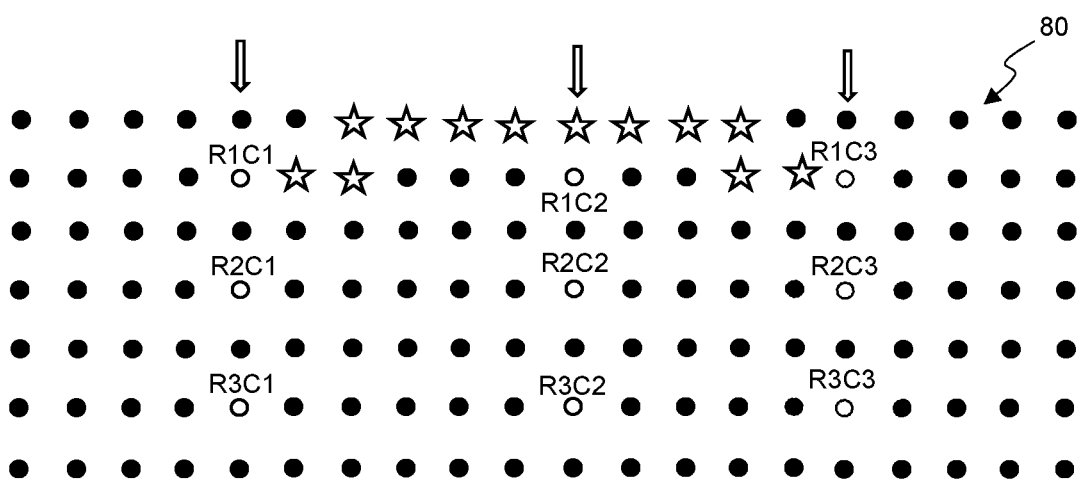

2—A wire path consists of a contiguous path of LEDs. That is, an LED is bordered in the top, bottom, left or right by either two LEDs assigned to the same wire, or a breadboard pin and an LED. In FIG. 16, the lit-up LEDs (stars) represent a wire which connects R1C1 and R2C2.

3—LEDs positioned vertically between breadboard pins can only be assigned to indicate a wire that is moving horizontally. These LEDs are found in the columns with the breadboard pins as indicated by the arrows in FIG. 17. These LEDs allow pins in the same row to be connected without passing through a breadboard pin. For example, in connecting R1C1 and R1C3, the path, as indicated by the stars, needs to pass through one of such LEDs so as to avoid passing through a breadboard pin, namely, through R1C2.

Figure 18:
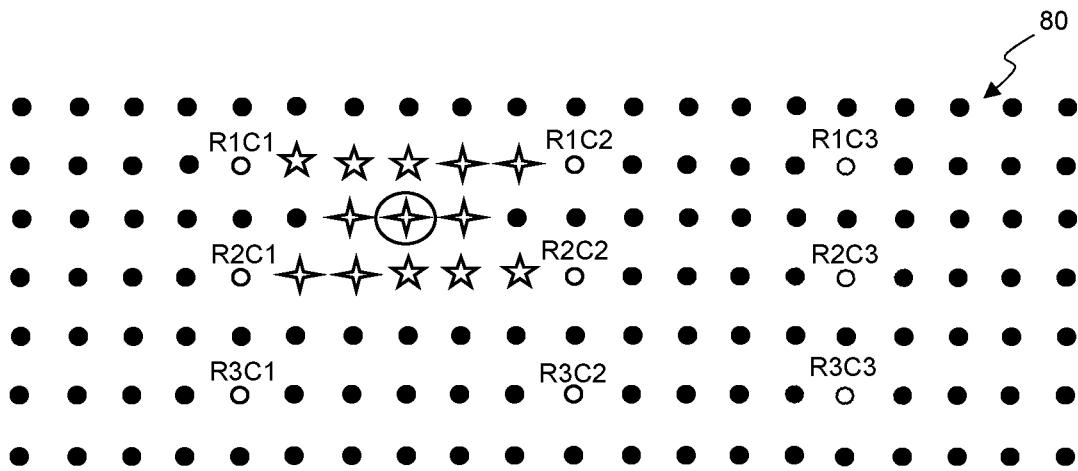

4—When tracing multiple wires, it is inevitable that wires will cross over each other. To reconcile this in a visually appealing manner, if two wires overlap, they will overlap by at most a single LED. For example, FIG. 18 shows a scenario in which a first wire (indicated by stars) is connecting R1C1 to R2C2 and a second wire (indicated by pluses) is connecting R2C1 to R1C2. The circled LED, which is circled only for ease of description, indicates where the wires overlap. In the illustrated embodiment, at the point where the two wires overlap, the LED assumes the color of the last wire to be drawn.

Figure 19:
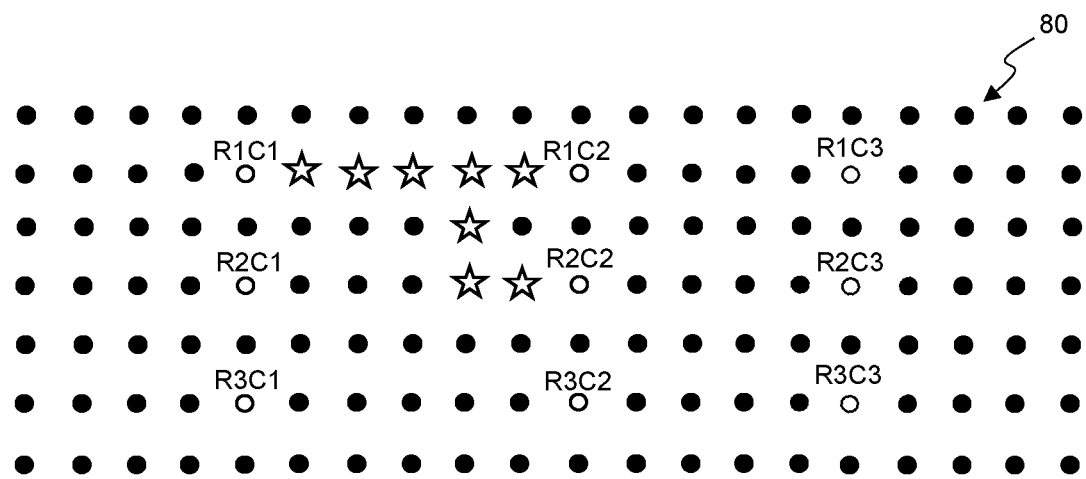

It is recognized that a wire can connect 2 or more breadboard pins. Referring to FIG. 19, a wire is drawn first between R1C1 and R1C2, and then a wire is drawn between R1C1 and R2C2. Electrically, these three pins are all connected together and part of the same net—it doesn't matter how they are wired together. FIG. 19 illustrates one valid way of displaying such a wiring configuration.

Figure 20:
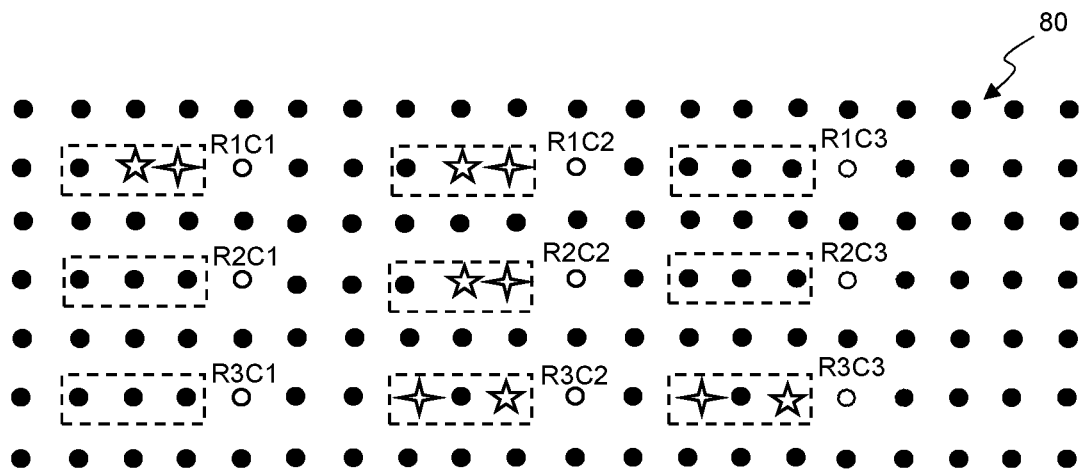
FIG. 20 is a schematic diagram illustrating another manner of visually indicting interconnected nodes utilizing an LED indicator assembly in accordance with an embodiment of the invention.

If there are too many wires, such that displaying all of the wires is too complicated/messy, it may be beneficial to utilize a modified display as illustrated in FIG. 20. In this embodiment, the same LED matrix 80 is utilized, however, only certain ones of the LEDs will be lit, for example, only the 3 LEDs next to each pin as indicated by the boxes in FIG. 20. Each wire will be assigned a unique color or sequence of colors. If pin is connected via that wire, the assigned color or sequence will be lit up within the three boxes associated with that pin. In the illustrated example, a wire with the assigned sequence of off (black circle), red (star), blue (plus) connects the pins R1C1, R1C2 and R2C2 and a wire with the sequence of blue (plus), off (black circle), red (star) connects the pins R3C2 and R3C3. Various colors (created using RGB LEDs) and sequences may be utilized to represent each wire.

Figure 21:
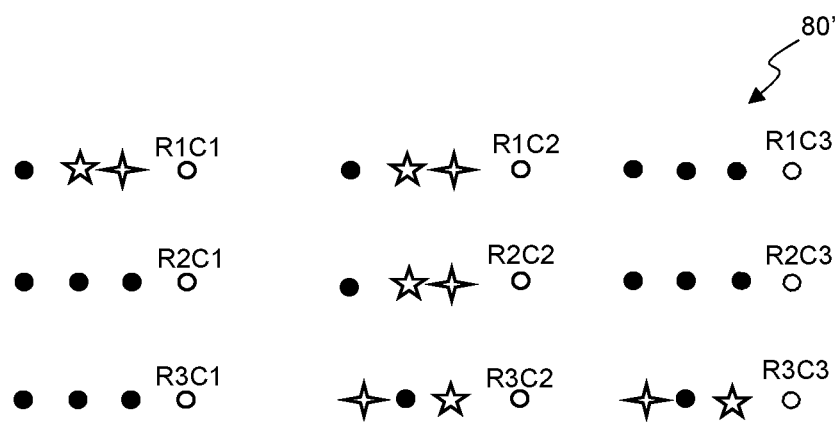
FIG. 21 is a schematic diagram illustrating yet another manner of visually indicting interconnected nodes utilizing an LED indicator assembly in accordance with another embodiment of the invention.

The embodiment illustrated in FIG. 21 is similar to the previous embodiment except that the LED matrix 80' excludes the LEDs that are not utilized. That is, only the 3 (or however many chosen) LEDs next to each pin are provided. In other aspects, the LED matrix 80' functions in the manner described with respect to the previous embodiment.

Figure 22:
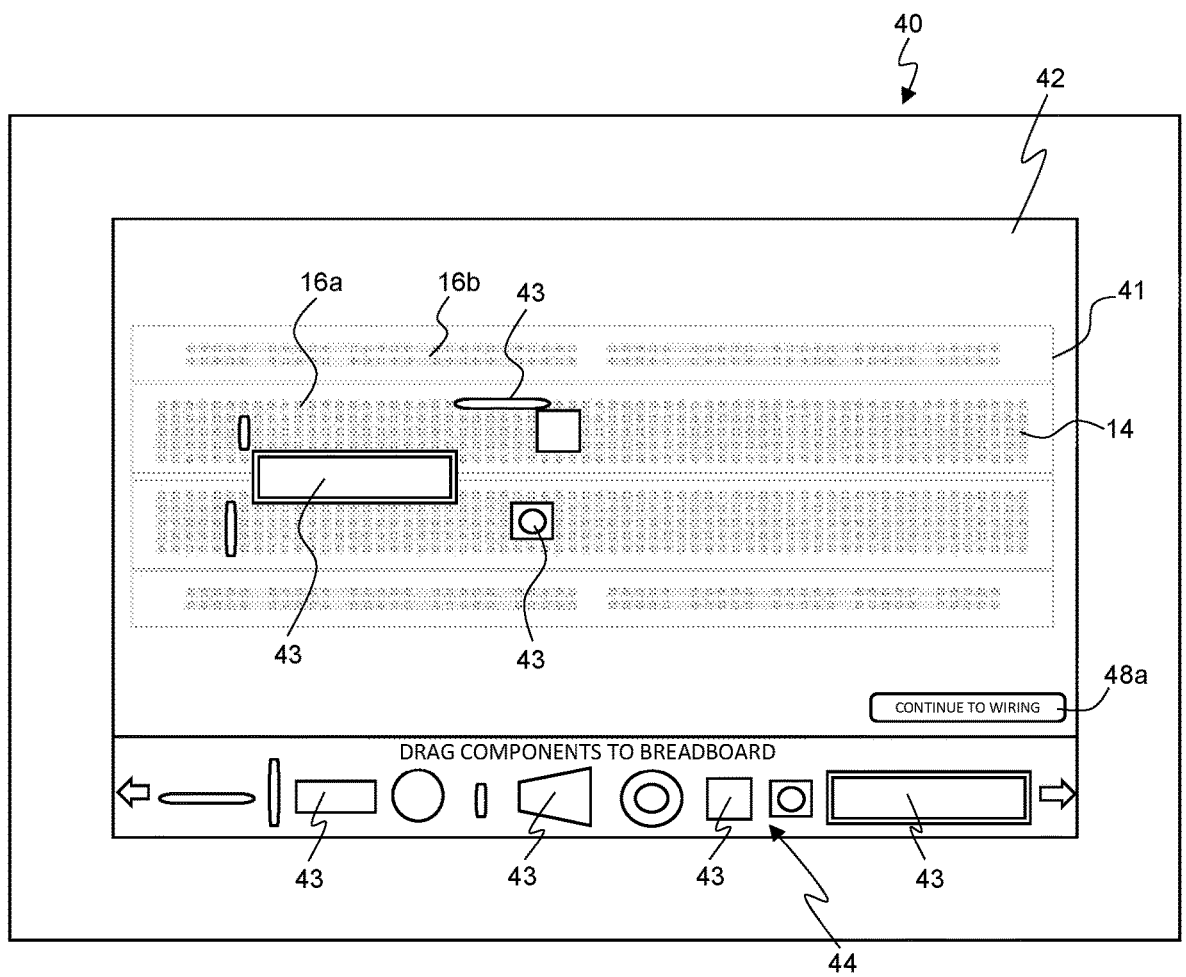
FIGS. 22 and 23 are screen shots illustrating virtual wiring of a circuit on a breadboard in accordance with an embodiment of the disclosure.
Figure 23:
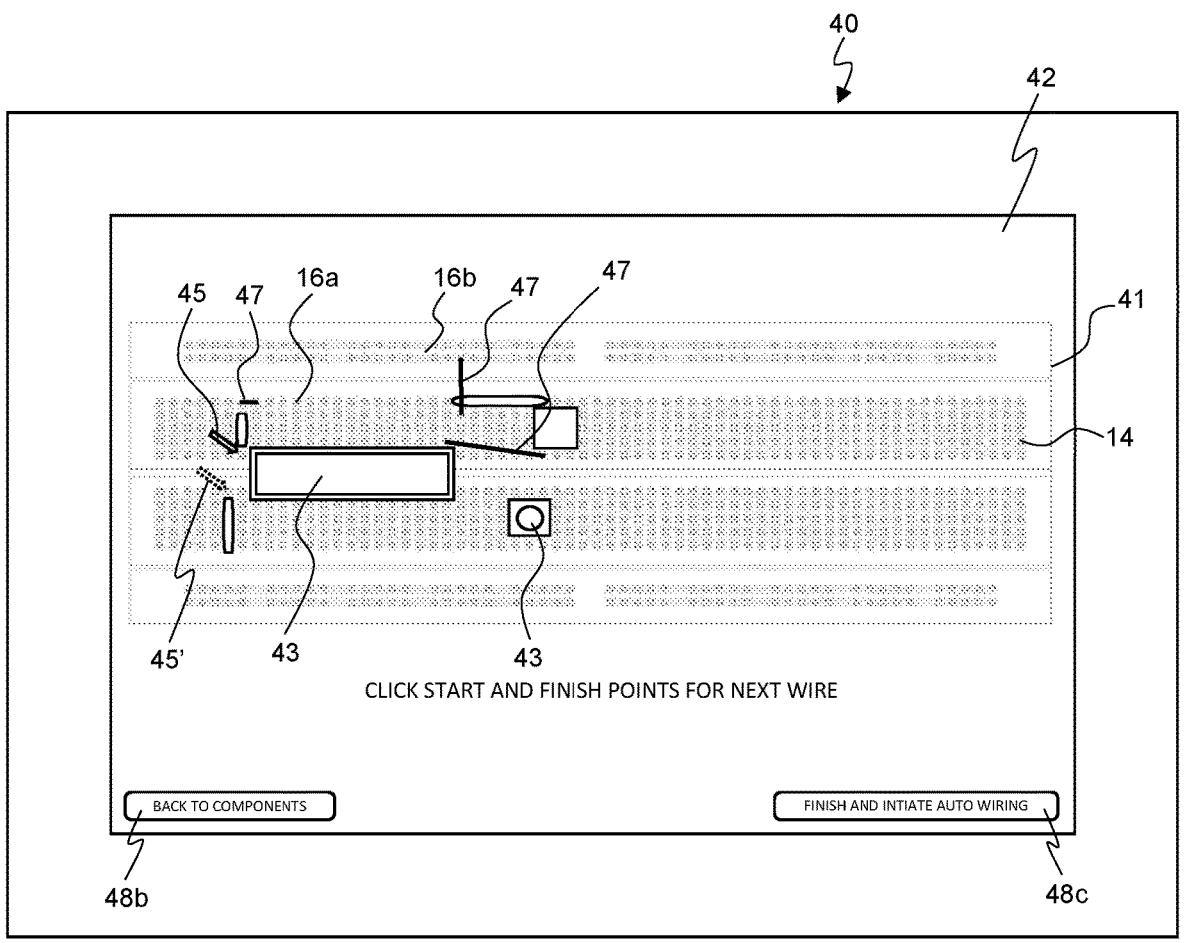

Referring to FIGS. 22 and 23, a method of inputting wiring information into the input device 40 will be described. The component input screen is shown in FIG. 22. A virtual breadboard 41 which corresponds to the physical breadboard 10 is displayed on the screen 42. A menu 44 of circuit components 43 is shown on the screen 42 and the user may drag and drop the components 43 on the virtual breadboard 41 in the same manner in which the components are positioned on the physical breadboard 10. It is understood that input device 40 is configured to allow the user to adjust sizes, rotate or otherwise manipulate the components 43. Additionally, while a drag and drop interface is illustrated, other interfaces, for example coordinate input, may be utilized.

Once all of the components 43 have been placed on the virtual breadboard 41 such that it matches the physical breadboard 10, the user clicks at 48a to advance to the wiring screen as shown in FIG. 23. The user clicks a wire start arrow 45 or the like on the starting hole 14 of a desired wire and then clicks a wire finish arrow 45' on the finish hole 14 of the wire. The system is configured to draw a virtual wire 47 extending between the holes 14. The user can quickly and easily see that the wires 47 are in the correct, desired positions. If any additional components are required, the user can click as indicated at 48b to return to the component input screen. Once all of the wires 47 are placed, the user can then click as indicated at 48c to finish and initiate the auto wiring of the physical breadboard 10. It is further contemplated that the user may have the option to test/simulate the virtual circuit prior to initiating the auto wiring. The input device 40 may be configured to test the virtual circuit and provide visual feedback to the user of any in continuities in the wiring and allow the user to inspect the simulation and observe waveforms and other electrical properties of nodes throughout the circuit.

Upon initiation of the auto wiring process, the microprocessor 70 receives the wiring information from the input device 40. The microprocessor then opens each switch 57 necessary to route electrical interconnection along the contacts 56, 58 and wire segments 55 corresponding to the wires in the wiring information. Once the auto wiring process is complete, the components on the physical breadboard 10 will be electrically interconnected in the manner set forth on the virtual breadboard. Any changes in wiring can be made easily through the input device 40.

Figure 24:
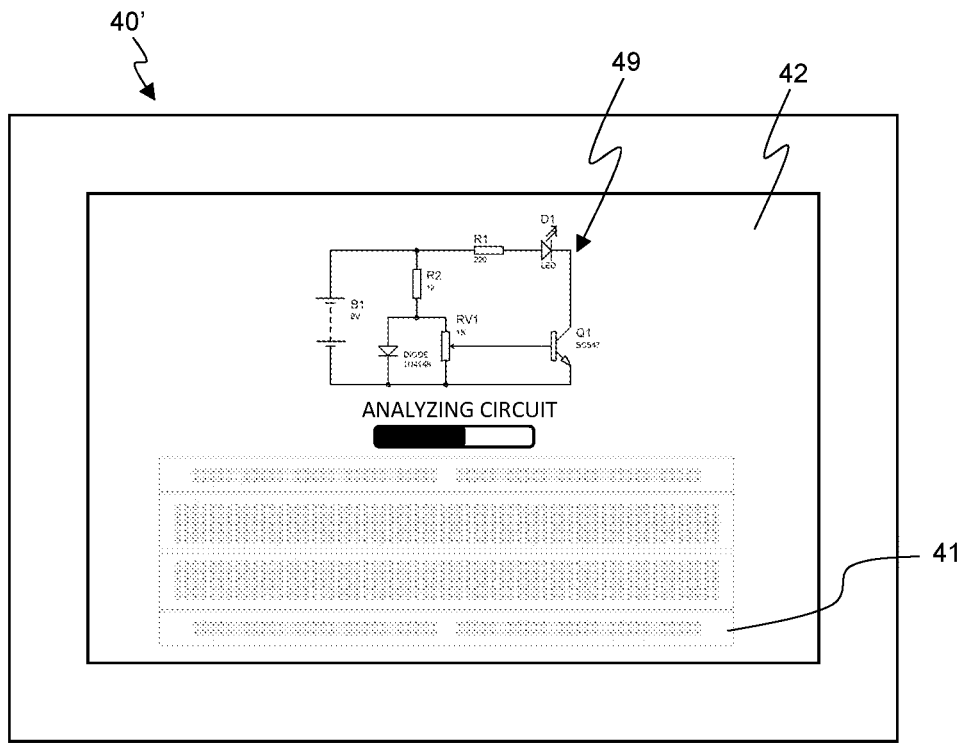
FIGS. 24 and 25 are screen shots illustrating virtual wiring of a circuit on a breadboard in accordance with another embodiment of the disclosure.
Figure 25:
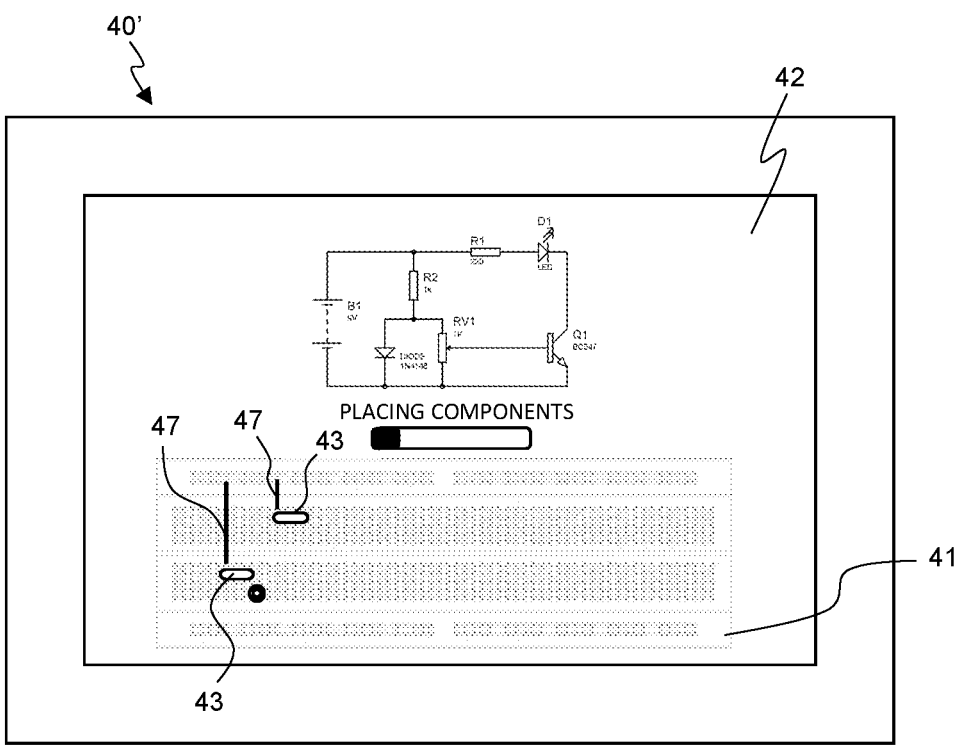
Figure 26:
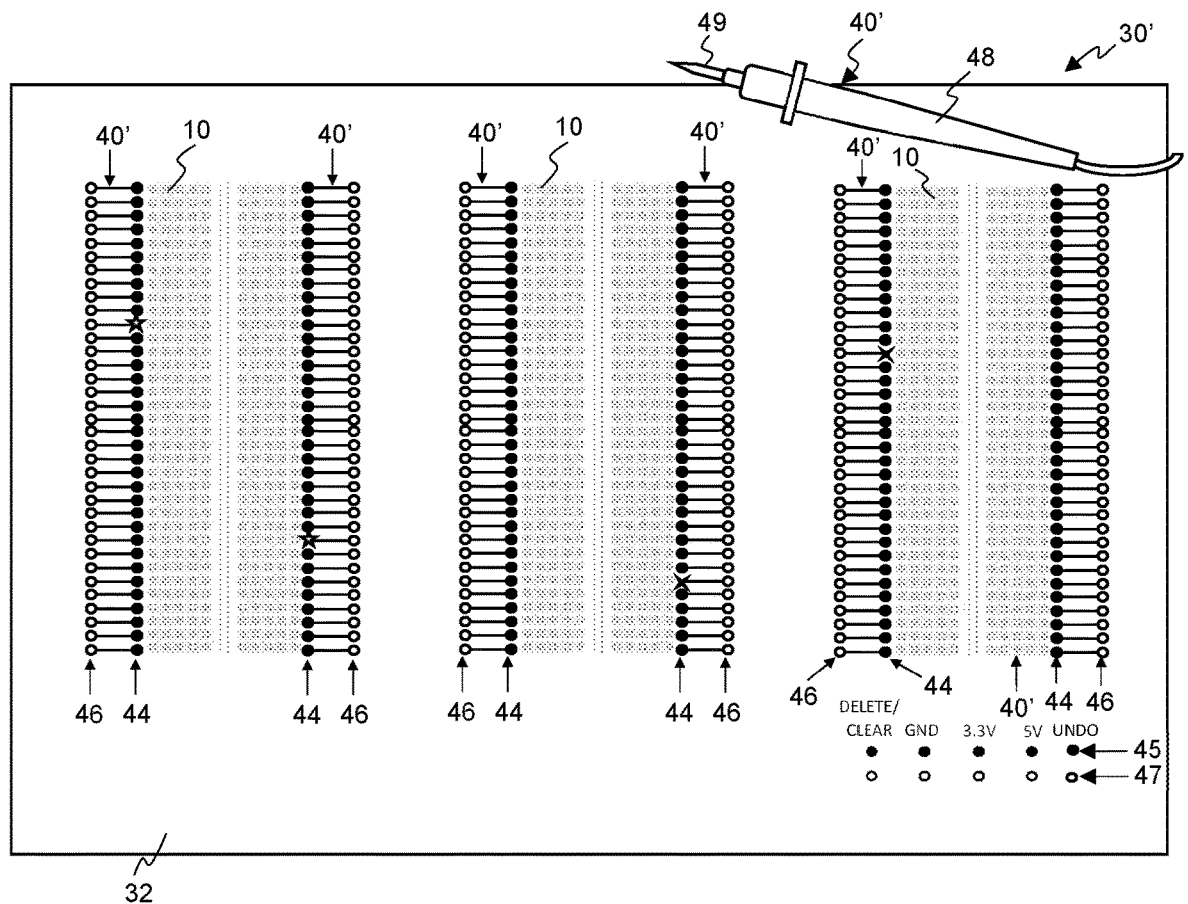
FIG. 26 is a plan view of a standalone breadboard assembly in accordance with an embodiment of the invention.
Figure 27:
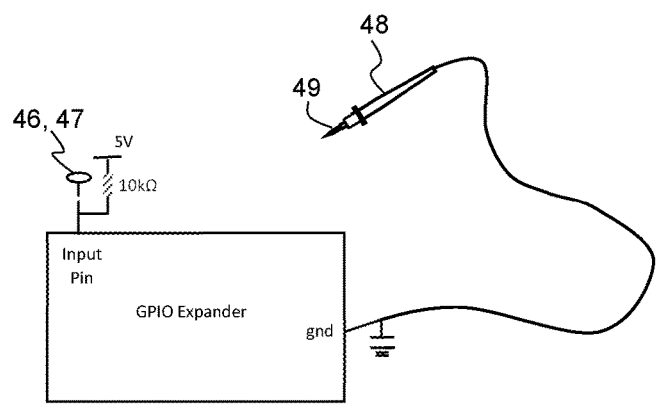
FIG. 27 is a schematic view of an illustrative stylus and contact pin assembly of the breadboard assembly of FIG. 26.

Referring to FIGS. 24 and 25, an alternative method of inputting wiring information into the input device 40' will be described. In this embodiment, the user inputs a circuit diagram 49 into the input device 40' with the components identified in a manner readable by the input device processor. For example, the circuit diagram 49 may be created utilizing a schematic design tool which is compatible with the input device 40' such that the input device 40' recognizes each of the components and their interconnection. As illustrated in FIG. 24, the input device 40' analyzes the circuit to identify each component and the interconnections between the components. Once the circuit is analyzed, the input device 40' is configured to lay out the virtual components 43 and virtual wiring 47 on the virtual breadboard 41 as illustrated in FIG. 25. Once the layout on the virtual breadboard 41 is complete, the user can place the components on the physical breadboard 10 in the same positions as shown on the virtual breadboard 41 and then send the wiring information to the microprocessor 70 to complete auto wiring.

Referring to FIGS. 26-35, a standalone breadboard assembly 30' in accordance with an embodiment of the invention will be described. The standalone breadboard assembly 30' incorporates a system of LEDs and button/contact interfaces which act as the input device 40' such that the device can operate standalone and allow users to build complete circuits. It is noted that the standalone breadboard assembly 30' may also interface with a separate input device, e.g. a laptop or the like, to operate in a manner as described above.

The breadboard assembly 30' includes a housing 32 which holds one or more breadboards 10. Within the housing, one or more wiring boards and a processor (not shown), for example, a Raspberry Pi processor, are interconnected with the breadboards 10 to facilitate automated wiring as described above. The input device 40', as will be described, is integral with the housing 32 and allows the user to directly indicate which nodes are to be interconnected.

In the present embodiment, the input device 40' includes a plurality of breadboard LEDs 44, a plurality of breadboard contacts 46, a plurality of function LEDs 45, a plurality of function contacts 47 and a stylus 48. A breadboard LED 44 and breadboard contact 46 pair is associated with each breadboard pin 10. Similarly, a plurality of function LED 45 and function contact 47 pairs are provided to carry out desired functions as will be described hereinafter. The illustrated assembly includes contacts 47 for the following functions: Clear/Delete; GND; VCC 3.3; VCC 5.5; and Undo. Each of the LEDs is preferably an RGB LED such that it may be lit with various colors.

The user must use the stylus 48 to press the contacts 46, 47. Referring to FIG. 25, the stylus 48 plugs into an input jack in the housing 32 and has a metal tip 49 which is electrically grounded. In the illustrated embodiment, the contacts 46, 47 are metal pins which are connected to pull-up resistors. Each contact 46, 47 is connected to a GPIO input pin, which monitors the voltage of the contact 46, 47. When un-pressed, a contact 46, 47 is pulled up to 5 volts. If the user presses the stylus 48 to a contact 46, 47, an electrical connection is made between the contact 46, 47 and ground, and the contact's voltage becomes 0V. The changes in state (5V/un-pressed and 0V/pressed) of the contacts 46, 47 are monitored in software, which interprets these state changes to provide high-level functionality to the user. The software looks for changes between 0V and 5V, but also measures the time between state changes of a contact 46, 47, providing a lot of flexibility for creating different functionality (for example timed press operations like holding down the stylus on the reset function pin for 3 seconds to reset the board state).

Together, the breadboard contacts and LEDs, and the function contacts and LEDs offer the user the following functionality.

A user can place a wire connecting two breadboard pins. This can be accomplished by touching the stylus to the breadboard contact adjacent to one of the two pins, and then pressing the breadboard contact adjacent to the second pin. Once the user presses the second contact, a wire is routed in hardware in a manner described above, and the two breadboard LEDs next to these two breadboard pins are illuminated with the same RGB color, indicating that they are electrically connected.

Figure 28:
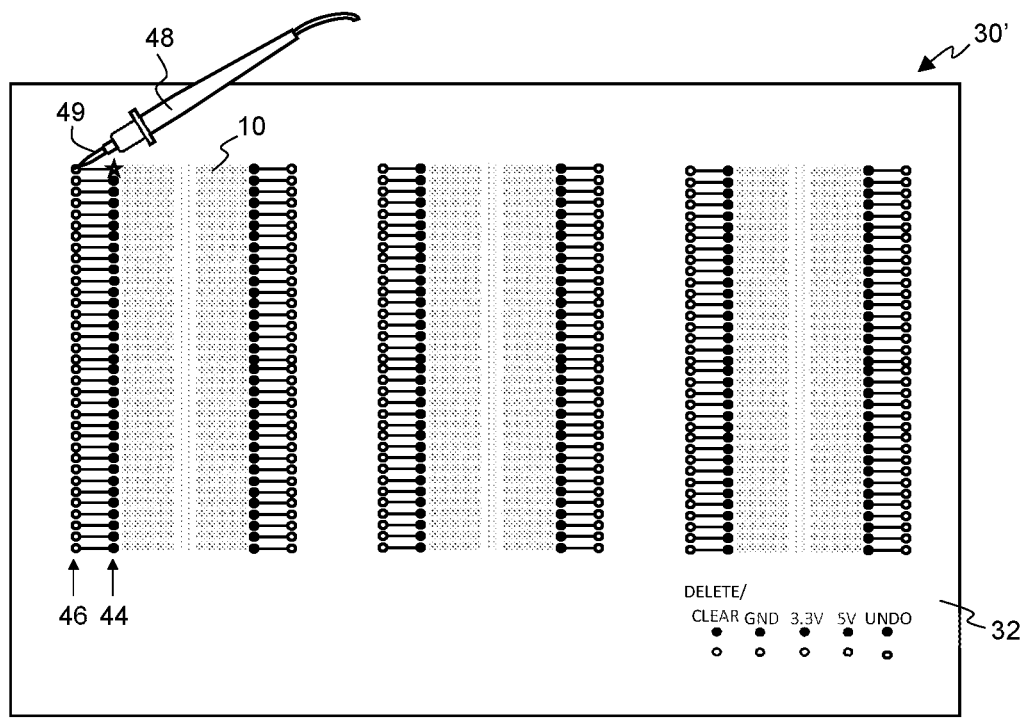
FIGS. 28-35 are plan views of the breadboard assembly of FIG. 26 illustrating various wiring sequences.
Figure 29:
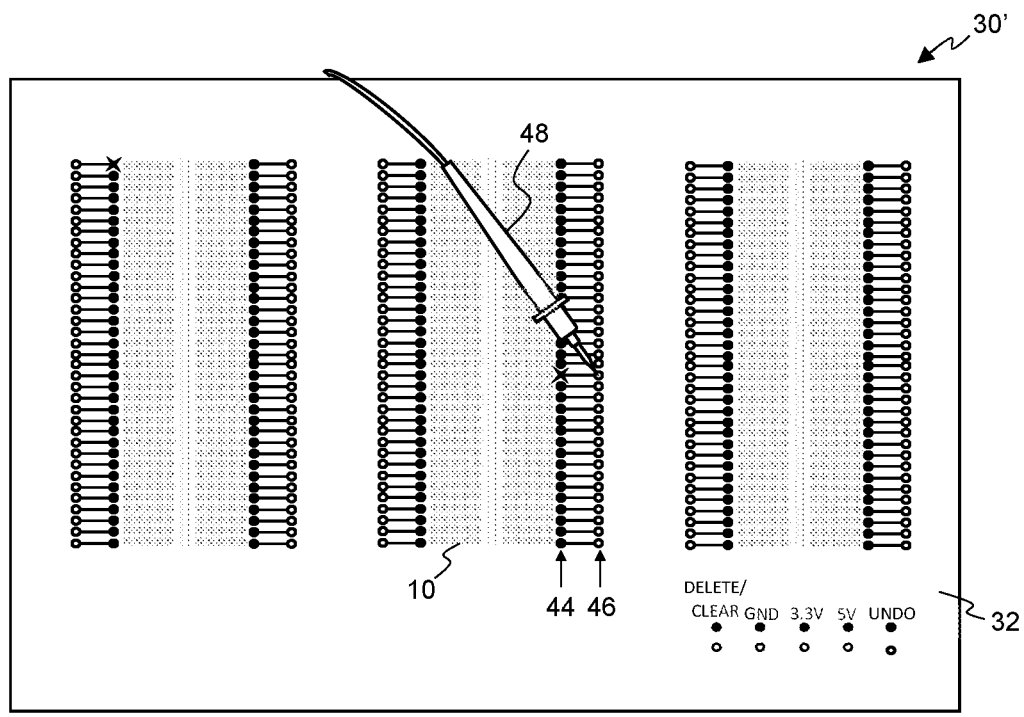

Referring to FIGS. 28 and 29, placing a wire from breadboard pin (row=1, col=1) to breadboard pin (20,4) will be illustrated. First, the stylus 48 is pressed to breadboard contact (1,1). In FIG. 28, breadboard LED (1,1) is illuminated yellow (indicated by a star). In the illustrated embodiment, yellow is used as an intermediate color to indicate that the user has selected a breadboard pin to perform a wiring operation. Turning to FIG. 29, the stylus 48 is next pressed to breadboard contact (20,4). Breadboard LEDs (1,1) and (20,4) are assigned their final color, for example, blue (indicated by an X).

By placing multiple wires, a user can create an electrical short/connection between 2 or more breadboard pins. Breadboard pins that are electrically shorted/connected are referred to herein as a net. Breadboard pins are considered electrically connected if they are reachable (in a graph algorithm sense) by traversing virtual wires.

If a user connects a breadboard pin with no connected wires to a net (including 2 or more bread board pins), the assembly places a wire to create an electrical connection between this pin and the net, and the LED adjacent to this new breadboard pin is illuminated with the same color as the net, indicating that it is now electrically connected with all breadboard pins in the net.

Figure 30:
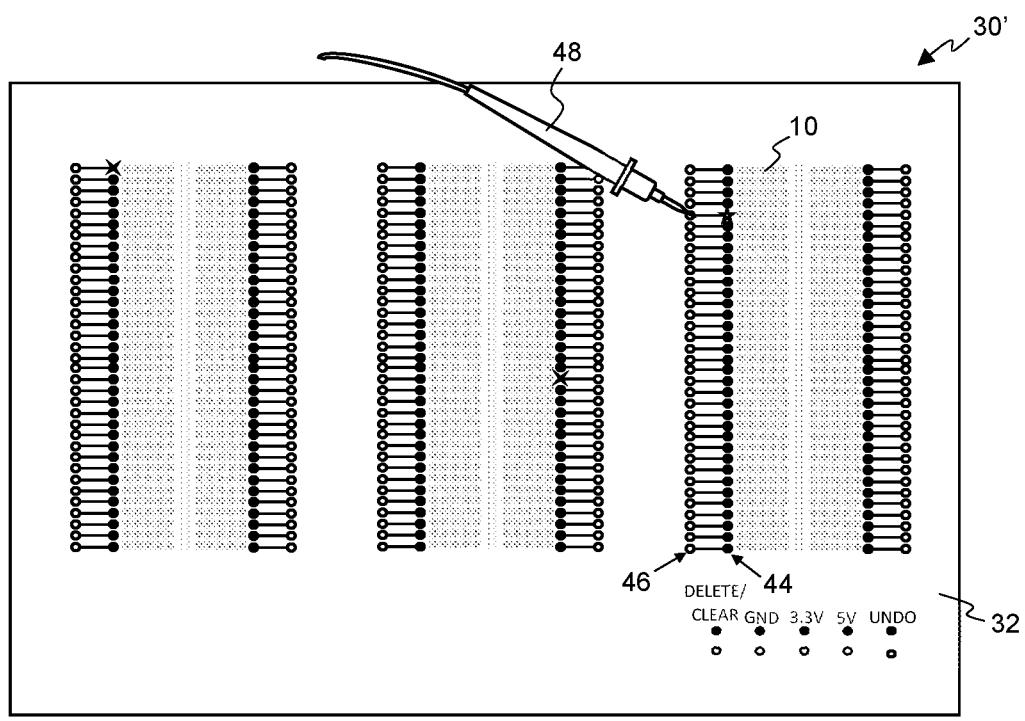
Figure 31:
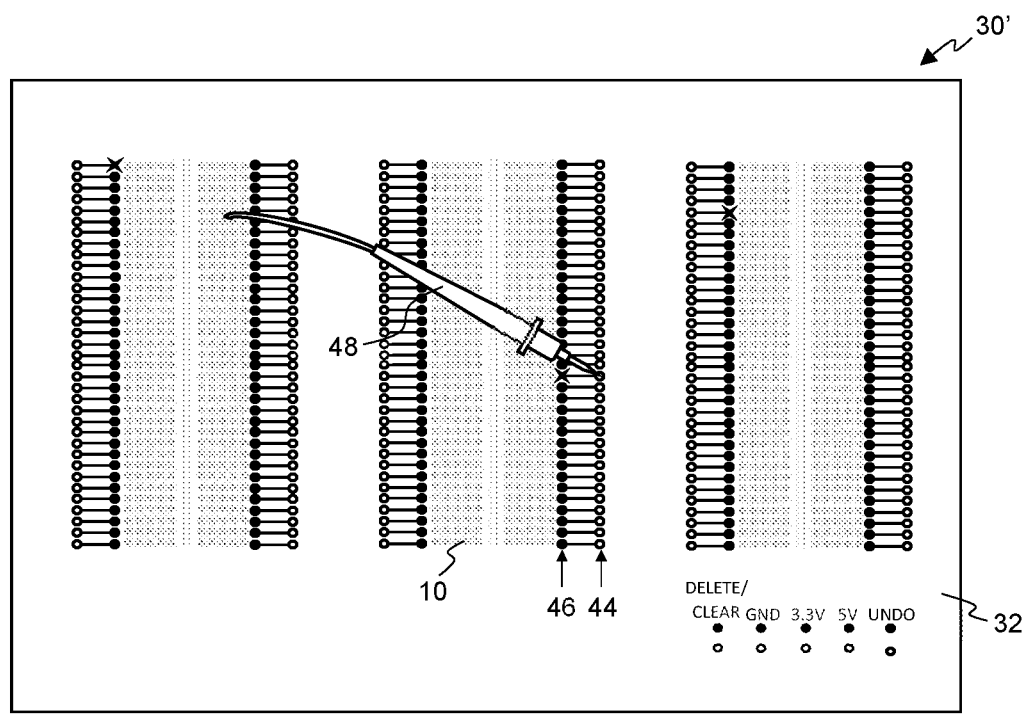

For example, FIGS. 30 and 31 illustrated the process of placing a wire from (5,5) to (20,4). As a first step, the user utilizes the stylus 48 to press the contact at pin (5,5) and the associated LED turns yellow (star), as shown in FIG. 30. The user than utilizes the stylus to press the contact at pin (20,4) as shown in FIG. 31. Breadboard pin (5,5) is added to the original net and its associated LED turns to the color of the net, in this case blue (X).

Figure 32:
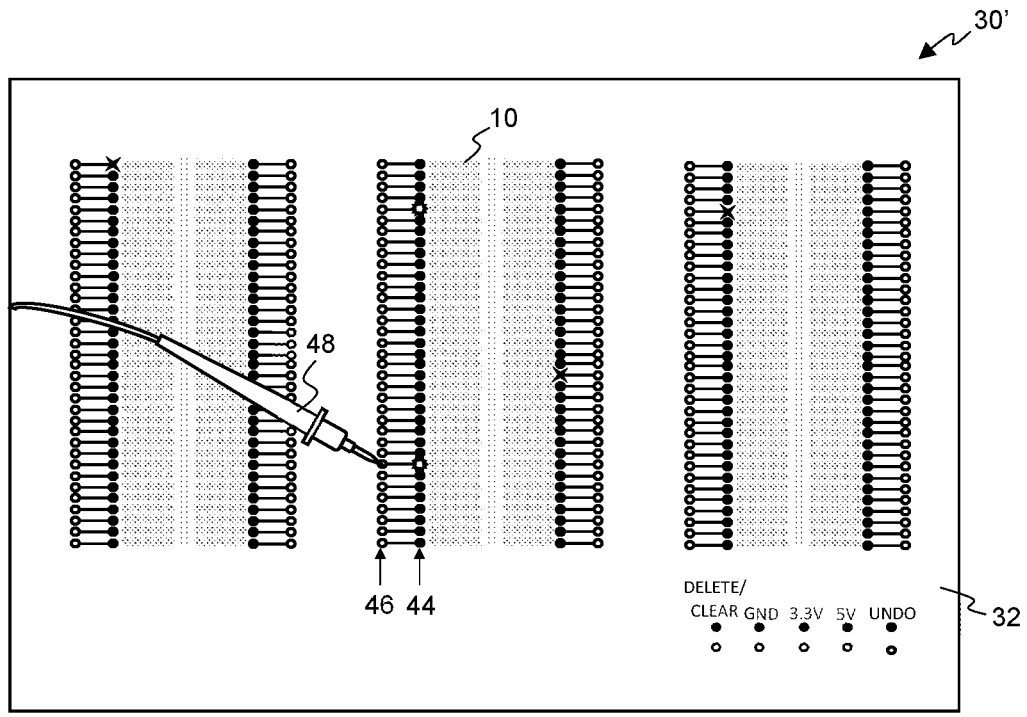

A user can also join two nets. By first selecting any one pin from net A, and then selecting any one pin from net B, a wire is placed between net A and B, such that nets A and B are electrically connected. Furthermore, arbitrarily, the color of the breadboard LEDs in net B are updated to the color of the breadboard LEDs in net A. Such a connection is illustrated with reference to FIGS. 32 and 33. In FIG. 32, the user creates a wire between (5,3) and (28,3) by pressing the breadboard contacts in that order. The associated LEDs shine the same color to represent the new net, for example, a greenish-yellow (indicated by a gear shape). Note that there are currently two nets, net A is blue (X) and net B is a greenish-yellow (gear shape).

Figure 33:
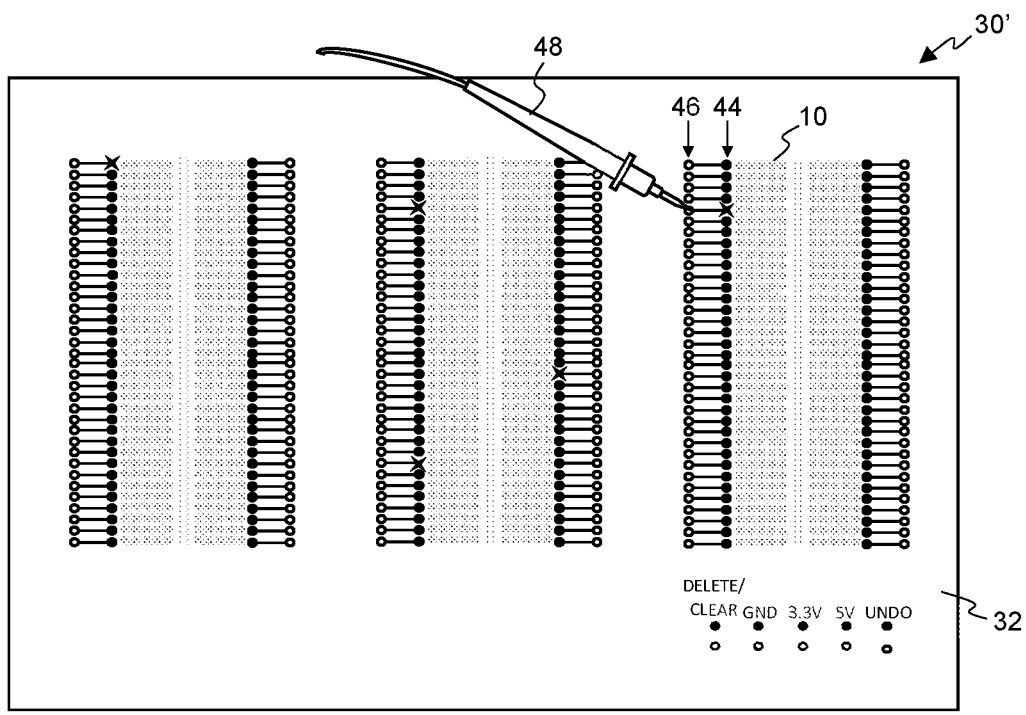

Turning to FIG. 33, the user next places a wire between (5,3) and (5,5). The two nets are joined into a single net and each of the associated LEDs shines the same color, namely, blue (X).

Figure 34:
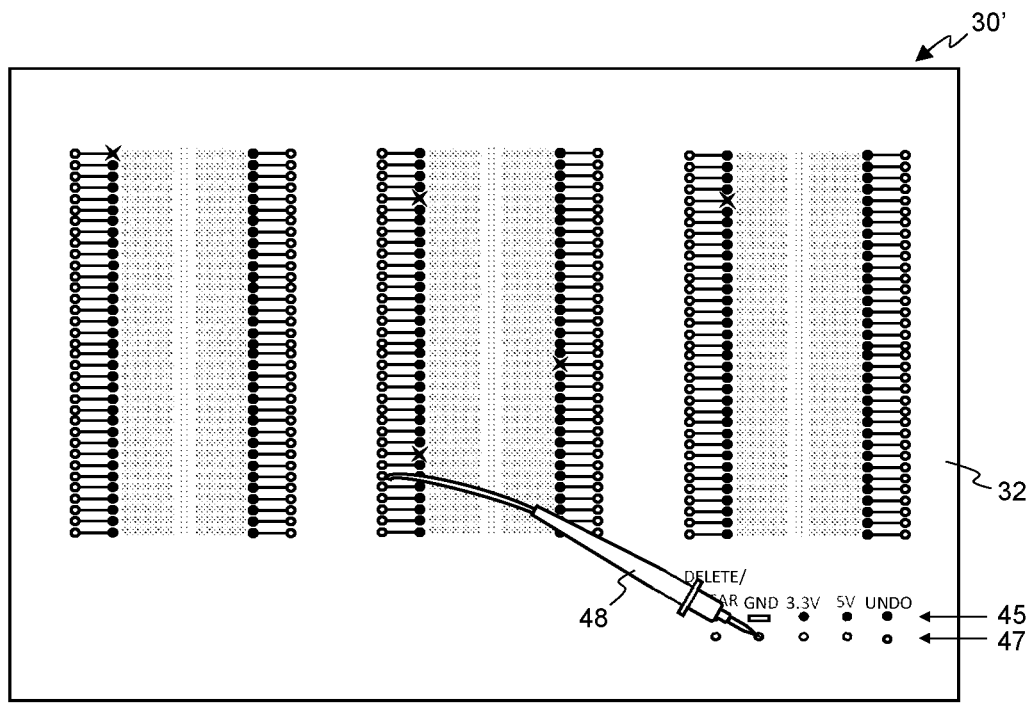
Figure 35:
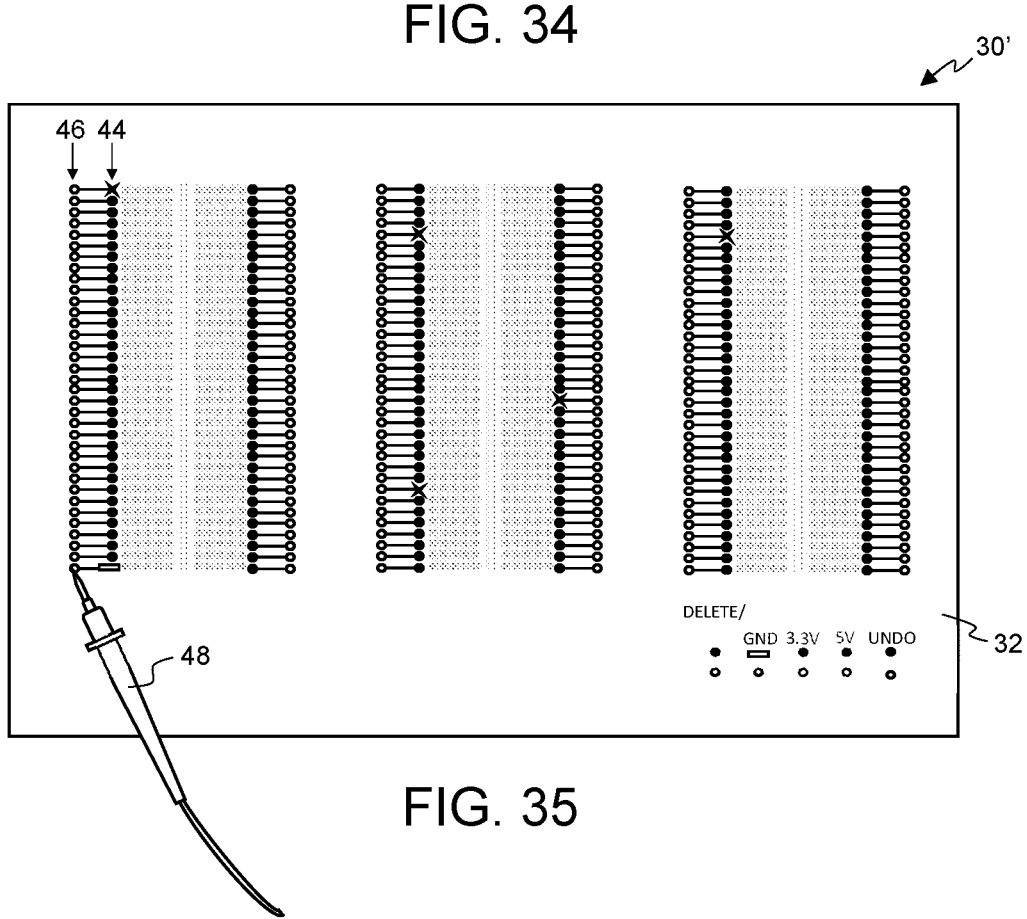

A user can also place a wire between a breadboard pin and power (3.3V or 5V) or ground (0V). They can do so by selecting a breadboard pin contact 46, and then pressing either the GND, VCC 3.3, or VCC 5 function contact 47. They can also perform this operation by pressing the function contact 47 first, and then the breadboard contact 46. FIGS. 34 and 35 illustrate a wire placed between GND and breadboard pin (35,1), wherein each associated LED is lit the same color, for example, green (indicated by a minus).

As an additional complexity, an entire net can be routed to GND, VCC 3.3, or VCC 5. If the user were to have routed one breadboard pin from a net (e.g. pin (1,1) to GND), then that net would have been electrically connected to ground, and the color of all LEDs would have been updated to green (minus) to indicate that all of the wires in that net are grounded. In one embodiment, VCC 3.3 is represented by orange, and VCC 5 is represented by red.

A user can remove all electrical connections to a breadboard pin. If they press the Delete/Clear function contact 47, and then the breadboard contact (or these operations in reverse order), any wires between that pin and GND, VCC 3.3, and VCC5 will be removed. Furthermore, if that breadboard pin is a member of a net, all wires connecting this pin to that net are removed such that the pin is not connected to the net, but the remainder of the net remains connected. Note that when removing a breadboard pin from a net, it is possible that such removal will break electrical connections within the net, such that the net is not fully connected (in a graph sense). In order to rectify this, additional wires are routed automatically to guarantee that the breadboard pins remaining in the net remain electrically connected. The LED color of the removed pin is reset to RGB (0, 0, 0).

A user can clear the state of the entire board by holding the stylus to the Delete/Clear function contact for at least 3 seconds. Once a timer has elapsed, all LEDs will be reset to (R=0, G=0, B=0) and all electrical connections will be removed.

The user can undo an immediately previous operation by pressing the stylus to the undo function contact.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein but is intended to include all changes and modifications that are within the scope and spirit of the invention as defined in the claims.

What is claimed is:

1. An automated breadboard wiring assembly comprising:
   a breadboard with holes therein defining at least two nodes;
   at least a primary wiring board having
      a wiring matrix composed of a plurality of interconnected wiring segments, each wiring segment having a switch therealong; and
      a plurality of contacts interconnected with the wiring matrix with a switch positioned between each contact and the wiring matrix, each contact configured to engage a respective one of the breadboard nodes;
   an input device configured to indicate desired wires between nodes, the locations of the desired wires defining wiring information; and
   a microprocessor configured to receive wiring information from the input device and open selective ones of the switches such that an electrical path along selective ones of the contacts and the wire segments is defined to correspond to each desired wire set forth in the wiring information.

2. The automated breadboard wiring assembly according to claim 1 further comprising a secondary wiring board having a second wiring matrix composed of a plurality of interconnected wiring segments, each wiring segment having a switch therealong, and the second wiring matrix electrically interconnectable with the wiring matrix of the primary wiring board via at least one switch.

3. The automated breadboard wiring assembly according to claim 2 further comprising a second secondary wiring board having a third wiring matrix composed of a plurality of interconnected wiring segments, each wiring segment having a switch therealong, and the third wiring matrix electrically interconnectable with the second wiring matrix via at least one switch.

4. The automated breadboard wiring assembly according to claim 1 wherein each of the switches is a bidirectional switch.

5. The automated breadboard wiring assembly according to claim 1 wherein the breadboard, primary wiring board and microprocessor are housed within a housing and the input device includes a contact button associated with each of the breadboard nodes.

6. The automated breadboard wiring assembly according to claim 5 wherein the input device further includes an LED associated with each of the breadboard nodes.

7. The automated breadboard wiring assembly according to claim 6 wherein the LEDs next to interconnected breadboard nodes light the same color.

8. The automated breadboard wiring assembly according to claim 5 wherein the input device further includes a stylus configured to electrically engage the contact buttons.

9. The automated breadboard wiring assembly according to claim 5 wherein the housing supports one or more additional contact buttons which facilitate additional functionality.

10. The automated breadboard wiring assembly according to claim 9 wherein the additional contacts provide one or more functions selected from the group of ground, 3.3 V, 5 V, clear and undo.

11. The automated breadboard wiring assembly according to claim 1 wherein at least one LED is associated with each breadboard node and the LEDs are configured to light up to indicate which breadboard nodes are interconnected.

12. An automated breadboard wiring assembly comprising:
 a breadboard with holes therein defining at least two nodes;
 at least a primary wiring board having
  a wiring matrix composed of a plurality of interconnected wiring segments, each wiring segment having a switch therealong; and
  a plurality of contacts interconnected with the wiring matrix with a switch positioned between each contact and the wiring matrix, each contact configured to engage a respective one of the breadboard nodes;
 an input device having a screen configured to display a virtual breadboard corresponding to the breadboard, the input device configured to position virtual circuit components and virtual wires on the virtual breadboard, the locations of the virtual wires defining wiring information; and
 a microprocessor configured to receive wiring information from the input device and open selective ones of the switches such that an electrical path along selective ones of the contacts and the wire segments is defined to correspond to each virtual wire set forth in the wiring information.

13. The automated breadboard wiring assembly according to claim 12 further comprising a secondary wiring board having a second wiring matrix composed of a plurality of interconnected wiring segments, each wiring segment having a switch therealong, and the second wiring matrix electrically interconnectable with the wiring matrix of the primary wiring board via at least one switch.

14. The automated breadboard wiring assembly according to claim 13 further comprising a second secondary wiring board having a third wiring matrix composed of a plurality of interconnected wiring segments, each wiring segment having a switch therealong, and the third wiring matrix electrically interconnectable with the second wiring matrix via at least one switch.

15. The automated breadboard wiring assembly according to claim 12 wherein each of the switches is a bidirectional switch.

16. The automated breadboard wiring assembly according to claim 12 wherein the input device is a computer in communication with the microprocessor.

17. The automated breadboard wiring assembly according to claim 16 wherein the communication between the computer and the microprocessor is achieve via a wired or a wireless interconnection.

18. The automated breadboard wiring assembly according to claim 12 wherein the input device provides visual representations of the virtual circuit components and is configured such that a user may select and position desired virtual circuit components on the virtual breadboard.

19. The automated breadboard wiring assembly according to claim 18 wherein the input device is configured such that a user may indicate the position of the virtual wires utilizing a pointer on the screen.

20. The automated breadboard wiring assembly according to claim 12 wherein the input device is configured to receive and analyze a wiring schematic and to position the virtual circuit components and virtual wires on the virtual breadboard such that they correspond with the wiring schematic.

* * * * *